United States Patent
Himmelhuber et al.

(10) Patent No.: US 11,758,694 B2
(45) Date of Patent: Sep. 12, 2023

(54) SWITCH CABINET ARRANGEMENT WITH AT LEAST ONE IT RACK OR SWITCH CABINET HOUSING AND WITH AT LEAST ONE COOLING UNIT, AND A CORRESPONDING METHOD

(71) Applicant: RITTAL GMBH & CO. KG, Herborn (DE)

(72) Inventors: Frank Himmelhuber, Kümmersbruck (DE); Stephan Helmut Matthies, Siegen (DE); Andreas Meyer, Fronhausen (DE)

(73) Assignee: RITTAL GMBH & CO. KG, Herborn (DE)

( * ) Notice: Subject to any disclaimer, the term of this patent is extended or adjusted under 35 U.S.C. 154(b) by 0 days.

(21) Appl. No.: 17/762,460

(22) PCT Filed: Sep. 23, 2020

(86) PCT No.: PCT/DE2020/100821
§ 371 (c)(1),
(2) Date: Mar. 22, 2022

(87) PCT Pub. No.: WO2021/058062
PCT Pub. Date: Apr. 1, 2021

(65) Prior Publication Data
US 2022/0346283 A1 Oct. 27, 2022

(30) Foreign Application Priority Data

Sep. 23, 2019 (DE) .................. 10 2019 125 512.0
Sep. 23, 2019 (DE) .................. 10 2019 125 534.1
(Continued)

(51) Int. Cl.
*H05K 7/20* (2006.01)
*H05K 7/14* (2006.01)
*H04Q 1/02* (2006.01)

(52) U.S. Cl.
CPC ....... *H05K 7/20781* (2013.01); *H05K 7/1488* (2013.01); *H05K 7/20736* (2013.01); *H04Q 1/025* (2013.01); *H04Q 1/035* (2013.01)

(58) Field of Classification Search
CPC ........... H05K 7/20781; H05K 7/20736; H05K 7/1488
See application file for complete search history.

(56) References Cited

U.S. PATENT DOCUMENTS 8,141,621 B2  3/2012 Campbell et al.
9,273,906 B2 * 3/2016 Goth .................. H05K 7/20836
(Continued)

FOREIGN PATENT DOCUMENTS

CN  106604618 A  4/2017
CN  108235655 A  6/2018
(Continued)

OTHER PUBLICATIONS

International Search Report (English and German) and Written Opinion of the ISA (German) issued in PCT/DE2020/100821, dated Apr. 8, 2021; ISA/EP.

(Continued)

*Primary Examiner* — Mukundbhai G Patel
(74) *Attorney, Agent, or Firm* — Harness, Dickey & Pierce, P.L.C.

(57) ABSTRACT

The invention relates to a switch cabinet arrangement with at least one IT rack or switch cabinet housing and with at least one cooling device, which has an air-liquid heat exchanger for cooling components accommodated in the IT rack or switch cabinet housing with cooled air, wherein the (Continued)

Figure 1:
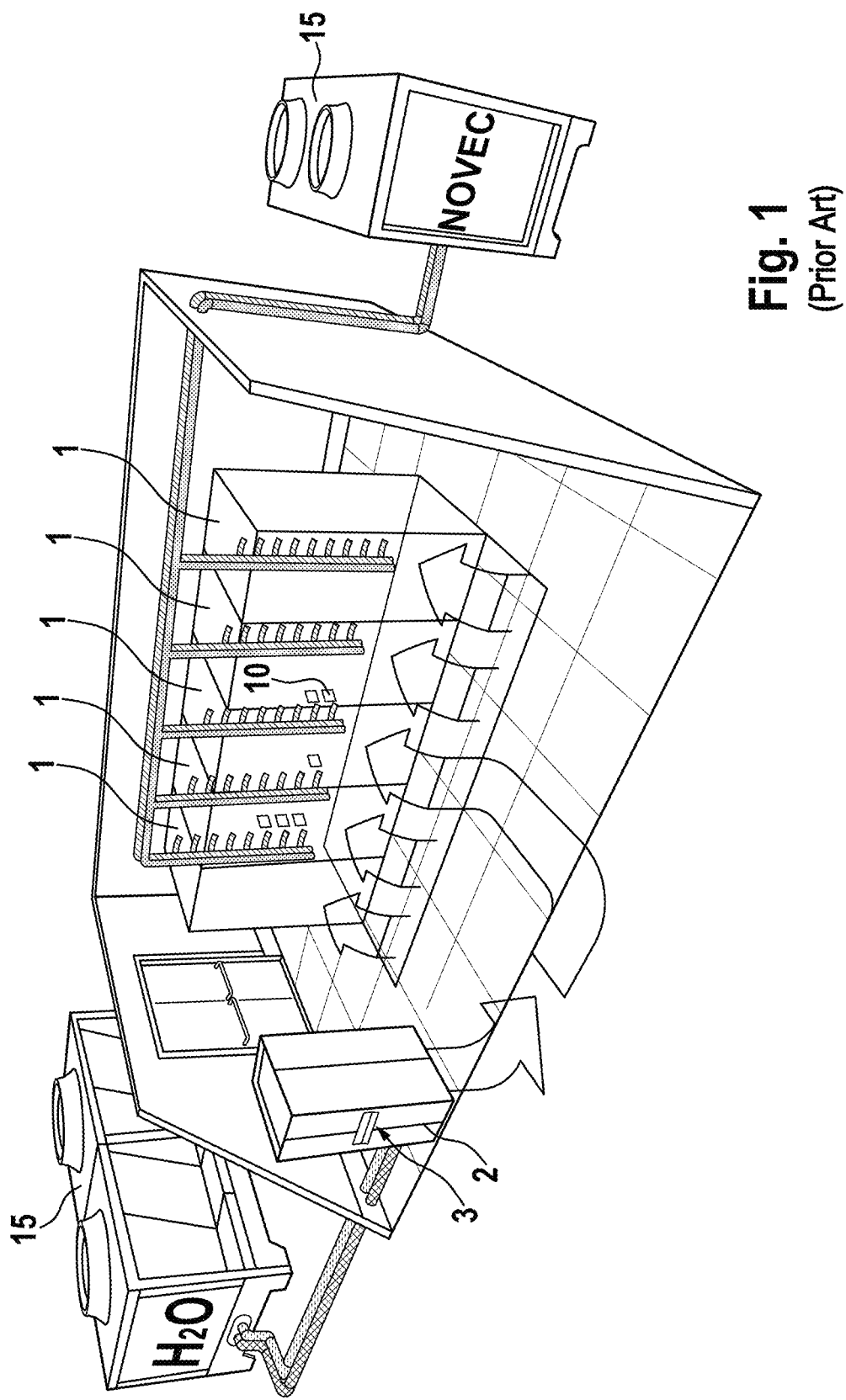

air-liquid heat exchanger comprises a first flow for cooled liquid and a first return for heated liquid, wherein the cooling device comprises a liquid-liquid heat exchanger, to the second flow of which the first return of the air-liquid heat exchanger is connected. A corresponding method is further described.

15 Claims, 29 Drawing Sheets

(30) Foreign Application Priority Data

Feb. 28, 2020 (DE) .................. 10 2020 105 359.2
Aug. 13, 2020 (WO) ................ PCT/DE2020/100704

(56) References Cited

U.S. PATENT DOCUMENTS 9,445,529 B2  9/2016  Chainer et al.
9,655,286 B2  5/2017  Krug, Jr. et al.
2006/0037331 A1  2/2006  Nicolai et al.
2006/0037334 A1  2/2006  Tien et al.
2007/0274043 A1  11/2007  Shabany
2008/0094797 A1  4/2008  Coglitore et al.
2012/0279684 A1  11/2012  Keisling et al.
2013/0107447 A1  5/2013  Campbell et al.
2014/0022725 A1  1/2014  Schultz
2016/0120059 A1  4/2016  Shedd et al.
2018/0027698 A1  1/2018  Cader et al.
2019/0150326 A1  5/2019  Gao et al.
2021/0068300 A1* 3/2021  Chehade ............ H05K 7/20609

FOREIGN PATENT DOCUMENTS

CN      108882658 A    11/2018
DE   102015101022 B3    4/2016
EP       2425312 A2    3/2012

OTHER PUBLICATIONS

German International Preliminary Report on Patentability issued in PCT/DE2020/100821, dated Feb. 9, 2022.

* cited by examiner

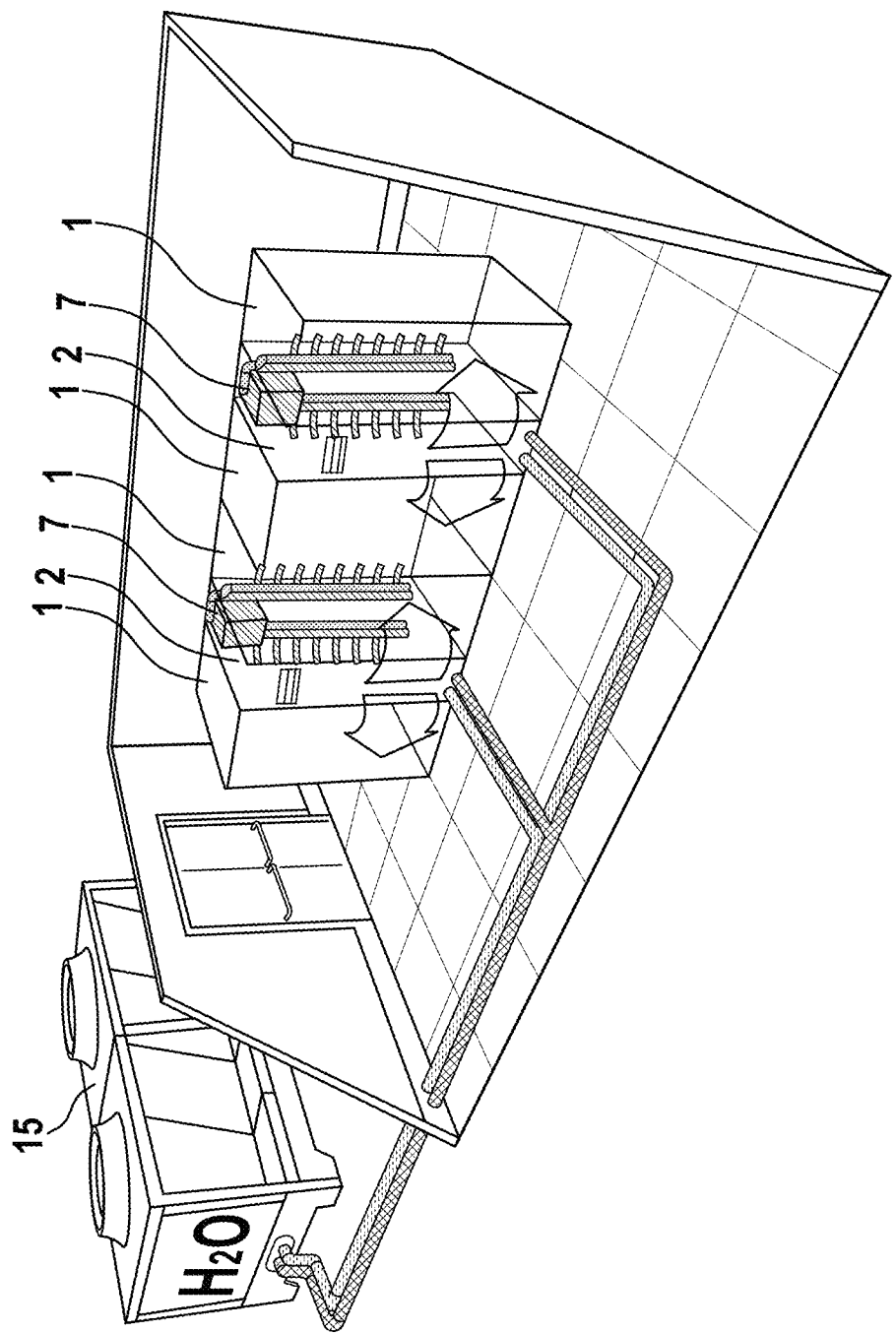

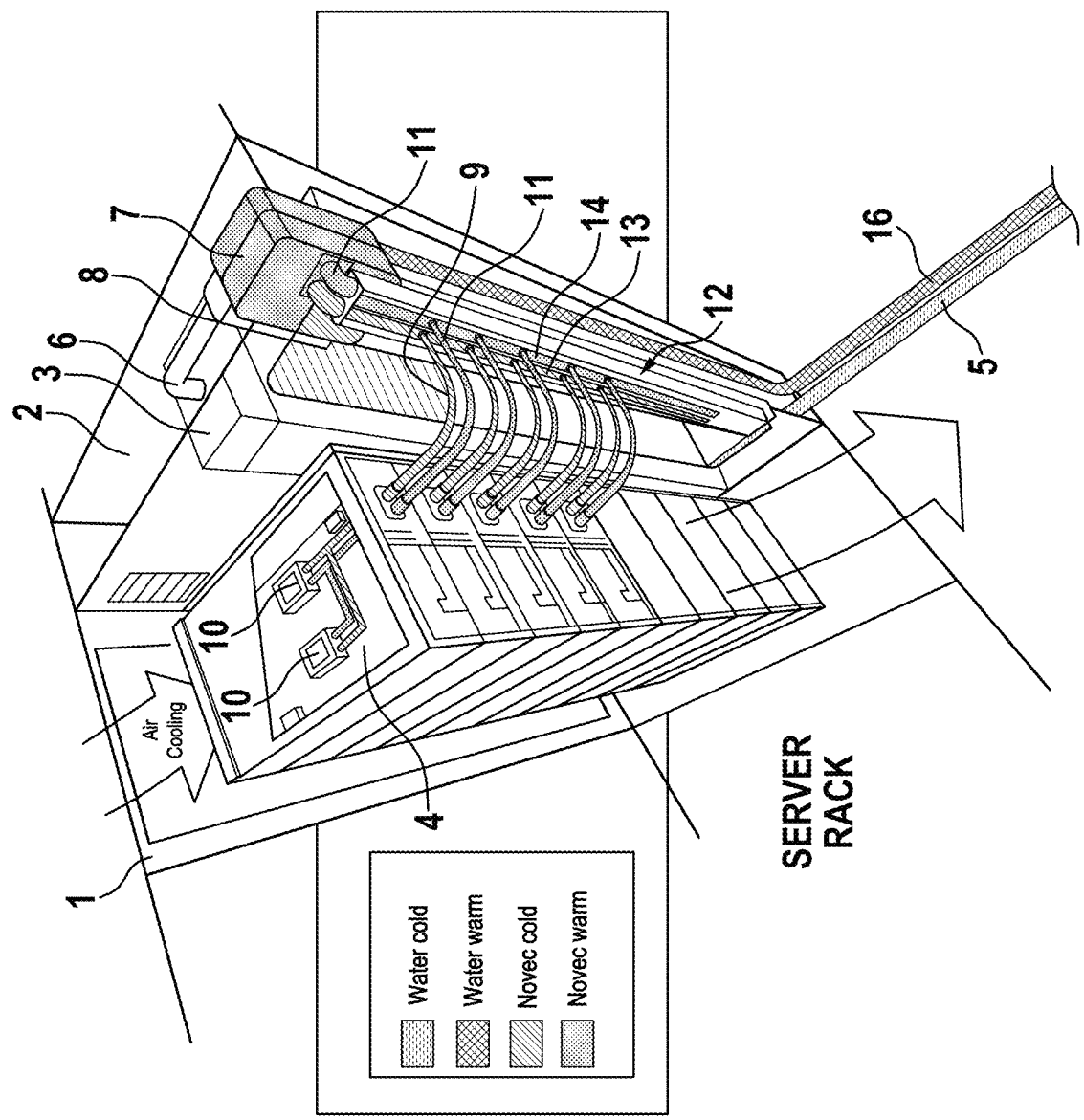

SWITCH CABINET ARRANGEMENT WITH AT LEAST ONE IT RACK OR SWITCH CABINET HOUSING AND WITH AT LEAST ONE COOLING UNIT, AND A CORRESPONDING METHOD

CROSS-REFERENCE TO RELATED APPLICATIONS

This application is a U.S. National Phase application under 35 U.S.C. 371 of International Application No. PCT/DE2020/100821, filed on Sep. 23, 2020, which claims the benefit of German Patent Application No. 10 2019 125 521.0, filed on Sep. 23, 2019, German Patent Application No. 10 2019 125 534.1, filed on Sep. 23, 2019, German Patent Application No. 10 2020 105 359.2, filed on Feb. 28, 2020, and International Application No. PCT/DE2020/100704, filed on Aug. 13, 2020. The entire disclosures of the above applications are incorporated herein by reference.

BACKGROUND

This section provides background information related to the present disclosure which is not necessarily prior art.

TECHNICAL FIELD

The invention is based on a switch cabinet arrangement with at least one IT rack or switch cabinet housing and with at least one cooling device, which has an air-liquid heat exchanger for cooling components accommodated in the IT rack or switch cabinet housing with cooled air, the air-liquid heat exchanger having a first flow for cooled liquid and a first return for heated liquid. Such a switch cabinet arrangement is known, for example, from DE 10 2015 101 022 B3.

DISCUSSION

The components arranged in a switch cabinet housing or in an IT rack generally have a high power loss depending on the design and a cooling power requirement that varies accordingly from component to component. On the other hand, the cooling power in common Switch cabinet arrangements is provided independently of the component with cooling air of the same temperature, which flows around the components requiring cooling. Consequently, the cooling air temperature and its flow velocity are always adjusted so that sufficient cooling power can be provided for the components with the highest cooling power requirement. Conversely, however, this has the consequence that components requiring less cooling are excessively cooled, making the overall cooling concept of the switch cabinet arrangement energy inefficient.

SUMMARY

This section provides a general summary of the disclosure, and is not a comprehensive disclosure of its full scope or all of its features.

It is therefore one aspect of the invention to further develop a switch cabinet arrangement of the type described at the beginning in such a way that energy-efficient cooling of components with different cooling power requirements of the same switch cabinet arrangement is possible.

Accordingly, it is provided that the cooling device comprises a liquid-liquid heat exchanger, to the second flow of which the first return of the air-liquid heat exchanger is connected.

The idea of the invention is thus based on providing, in addition to the standard air-liquid heat transfer, a second heat transfer between two liquids by means of an additional liquid-liquid heat exchanger. Due to the improved thermal conductivity of liquids compared to air, it is thus possible to provide a cooling liquid for cooling components that require a comparatively high cooling capacity. Furthermore, the improved thermal conductivity of the liquid compared to air allows the supply temperature of the liquid for liquid cooling of the components to be selected to be higher compared to the temperature of the cooling air, and therefore the heated liquid flowing out of the return of the air-liquid heat exchanger may still be sufficient to provide sufficient cooling of the second liquid for direct cooling of the components when fed into the supply of the liquid-liquid heat exchanger. The switch cabinet arrangement according to the invention therefore allows cooling at at least two different temperature levels, namely once at the temperature level of the cooled air flowing out of the air-liquid heat exchanger and once at the temperature level of the cooled liquid provided by the liquid-liquid heat exchanger, wherein the cooled liquid provided by the liquid-liquid heat exchanger may be substantially warmer than the cooling air, for example at least 20 K warmer.

The principle according to the invention can be scaled as desired. Instead of one liquid-liquid heat exchanger, several liquid-liquid heat exchangers can be fed by the return flow of the air-liquid heat exchanger. By suitable selection of the second liquid which serves for direct cooling of the components, by suitable selection of the flow rate of the respective liquid through the liquid-liquid heat exchanger and, if necessary, the additional variation of operating parameters, the temperature of the respective second liquid provided can be adjusted, so that a switch cabinet arrangement according to the principles of the invention can be provided with a plurality of different cooling liquid flow temperatures for direct cooling of components requiring different cooling power requirements.

The air-liquid heat exchanger can be part of a first cooling circuit and the liquid-liquid heat exchanger can be part of a second cooling circuit separate from the first. The first and/or the second cooling circuit may comprise at least one coolant, or a refrigerant, or another cooling medium, which is at least partially liquid and circulated in the respective circuit. The two cooling media may differ in particular with respect to their condensation temperature at which they change from an at least partially gaseous phase to a liquid phase.

The liquid passing through the air-liquid heat exchanger may be water or a liquid containing mostly water.

A first of the two liquids passed through the liquid-liquid heat exchanger may have a boiling point under standard conditions that is below the boiling point of the second liquid passed through the liquid-liquid heat exchanger, preferably at least 20 K, more preferably at least 30 K, and most preferably at least 40 K below the boiling point of the second liquid.

The second of the two liquids passed through the liquid-liquid heat exchanger may be or comprise a perfluorinated chemical compound, preferably a compound derived from ethyl isopropyl ketone, particularly preferably perfluoro(2-methyl-3-pentanone), $C_6F_{12}O$.

The second of the two liquids passed through the liquid-liquid heat exchanger may be introduced from a third return of the liquid-liquid heat exchanger into a liquid-carrying heat conducting body for conduction cooling.

The second of the two liquids passed through the liquid-liquid heat exchanger may have been introduced from the liquid-carrying heat transfer body into a third flow of the liquid-liquid heat exchanger.

The liquid-liquid heat exchanger may be the cooling zone of a heat pipe or a distribution pipe. The liquid-liquid heat exchanger can be formed in one piece or from several liquid-liquid heat exchangers fluidically connected in series or in parallel.

The heat pipe or the distribution pipe can have a downpipe and a riser pipe, which are designed as fluidically separated vertical lines or are fluidically connected to each other in a lowermost region of the heat pipe or distribution pipe via a siphon and/or a coolant collecting tank. The liquid coolant can be fed from the coolant reservoir via a pump into a flow line of a heat conducting body for conduction cooling of a semiconductor component.

The heat pipe or manifold may include a down pipe into which second liquid cooled from the liquid-liquid heat exchanger is introduced.

The heat pipe or manifold may include a riser pipe into which heated second liquid is introduced.

From a recooler, such as a chiller, chilled liquid may be introduced into the air-liquid heat exchanger via the first chilled liquid supply line.

The cooled liquid may be introduced into the recooler as a heated liquid from the liquid-liquid heat exchanger.

The cooling unit may be a cooling unit lined up in a row of IT racks or enclosures, with hot air drawn in from a hot aisle through the back or front of the unit and blown out as cooled air into a cold aisle through the side opposite the back or front.

The cooling unit may be housed within the enclosure and have a side cooling air outlet and a hot air inlet open to the same side, with a plurality of heat-emitting components disposed between them. Within the enclosure, cooling air exiting the cooling air outlet may be introduced past or through the components as heated air into the warm air inlet.

The air-liquid heat exchanger of the first circuit and the liquid-liquid heat exchanger of the second circuit can be arranged in a single-walled or double-walled rear door or front door of the IT rack or the switch cabinet housing. Air can flow through the air-liquid heat exchanger and the liquid-liquid heat exchanger, which enters the IT rack or the switch cabinet housing on a side arranged opposite the rear door or the front door. At least one fan and preferably a plurality of fans may be provided for air transport.

In accordance with another aspect of the invention, there is provided a switch cabinet arrangement having at least one IT rack or enclosure housing, wherein air is passed through the IT rack or switch cabinet housing for cooling components received in the IT rack or enclosure housing. In this case, a second air-liquid heat exchanger of a second cooling circuit is charged by the air, and a liquid passed through the air-liquid heat exchanger is supplied to at least one of the components for heat transfer from the component to the liquid and is discharged from the component back into the air-liquid heat exchanger.

The air can be introduced from outside the switch cabinet arrangement partly into the at least one IT rack or the switch cabinet housing and partly into a cooling unit housing, which is associated with the IT rack or the switch cabinet housing and fluidically separated therefrom and in which the air-liquid heat exchanger is accommodated. For this purpose, the air-liquid heat exchanger can be arranged in a cooling unit housing which is associated with the IT rack or the switch cabinet housing. Furthermore, an air-liquid heat exchanger of a further refrigerant circuit may be arranged in the cooling device housing, for example a water circuit, in which cooled water is provided via a recooler, for example a chiller, for the provision of cooled air by means of the further air-liquid heat exchanger. The one of the two air-liquid heat exchangers via which the cooled liquid is provided for direct cooling of the components may be arranged in the air flow passing through the enclosure downstream of the air-liquid heat exchanger providing cooled air for air cooling of the components. In particular, in the manner described above, the liquid direct cooling of the components may be implemented using a refrigerant that has a higher boiling point compared to the air that is commonly used for air cooling of components in, for example, an IT environment. For example, the cooled air that impinges on the components may have a temperature that is 25° C., while the boiling point of the refrigerant is greater than 50° C.

The air may be introduced into the at least one IT rack or the switch cabinet housing from outside the Switch cabinet arrangement, the Switch cabinet arrangement having an air duct in which the air acts on the components in its direction of flow after entering the IT rack or the switch cabinet housing before it acts on the air-liquid heat exchanger as air partially heated by the components. As previously described, due to the comparatively high boiling point of the refrigerant for component liquid cooling, air that has already been preheated after passing through the components can still be used to condense the refrigerant. For example, the cooling air may have a temperature of 25° C. when it enters the IT rack or cabinet enclosure. After passing through the components, it may have a temperature of 35° C. After passing the air-liquid heat exchanger, the air may have a temperature of more than 50° C.

The air-liquid heat exchanger of the second circuit can be arranged in a single-walled or double-walled rear door or front door of the IT rack or the switch cabinet housing, with air flowing through the air-liquid heat exchanger and entering the IT rack or the switch cabinet housing on a side arranged opposite the rear door or the front door.

The IT rack or cabinet enclosure may have an air flow path in which the air in its direction of flow after entering the IT rack or cabinet enclosure impacts the components before entering the rear door or front door as air partially heated by the components and impacting the air-liquid heat exchanger of the second circuit.

The second air-liquid heat exchanger may have a housing with an annular gap formed between an outer wall and a tubular inner wall, through which the liquid is passed in thermal contact with at least the inner wall. In this case, the inner wall can enclose a fan, which is arranged to guide the air past the inner wall through the housing.

A method for air conditioning a switch cabinet arrangement may include the steps of:
Exposing components housed in an IT rack or a cabinet enclosure of the cabinet assembly to air, wherein the air is heated to a first temperature, and
Passing the air heated to the first temperature through an air-liquid heat exchanger, cooling a liquid of a liquid cooling the components and heating the air to a second temperature greater than the first temperature.

In this case, after passing through the heat exchanger at the second temperature, the air can be discharged into the environment of the switch cabinet arrangement or cooled by another heat exchanger and recirculated for re-impingement of the components with air.

After passing through the heat exchanger, the air at the second temperature can be conducted away from the switch cabinet arrangement via a chimney. The chimney can open into a further air-liquid heat exchanger, for example into a further air-liquid heat exchanger to which a cooled liquid cooling medium is supplied via a chiller.

An alternative method for air conditioning a switch cabinet arrangement may include the steps of:
  Charging components housed in an IT rack or a switch cabinet housing of the switch cabinet arrangement with air, whereby the air is heated,
  Passing the heated air through an air-liquid heat exchanger, cooling the air and heating a first liquid passed through the air-liquid heat exchanger,
  Passing the heated first liquid through a liquid-liquid heat exchanger, wherein a second liquid passed through the liquid-liquid heat exchanger of a liquid cooling the components is cooled and the first heated liquid is further heated.

The first further heated liquid can be discharged from the liquid-liquid heat exchanger, cooled outside the switch cabinet arrangement, and recirculated as a cooled liquid into the air-liquid heat exchanger.

For the heat transfer from the component to be cooled to a coolant, which can be designed in particular as a cooling liquid, a cooling arrangement can be provided for the direct cooling of the components, for example a cooling arrangement for the direct cooling of semiconductor components, such as CPUs. The arrangement may comprise at least one heat conducting body having a cavity, through which a coolant flows and which is arranged to contact a semiconductor component with its underside in a thermally conductive manner. The heat conducting body can have a coolant inlet opening into the cavity and a coolant return opening into the cavity. The coolant inlet can advantageously be arranged above the coolant return.

The coolant inlet can have an adjustable closing element with which a vertical opening cross section of the coolant inlet can be adjusted. The closing element can have a slide valve which is linearly adjustable, the slide valve preferably being adjustable in the vertical direction and opening the opening cross section in a lowest position and at least partially closing it in an uppermost position.

The coolant inlet can be supplied with coolant via a coolant pump. The pump can supply the coolant as liquid coolant from a coolant reservoir and via a coolant supply line to the coolant inlet.

A plurality of the heat conducting bodies can be fluidically connected in parallel in that the heat conducting bodies are connected to the same coolant supply line via their respective coolant inlet. The at least one heat conducting body can be connected via its coolant return to a condensation zone, in which coolant exiting via the coolant return and at least partially evaporated is cooled. The condensation zone may have a liquid-liquid heat exchanger through which the coolant passed through the at least one heat conducting body is passed along a first coolant circuit. A liquid passed through a second coolant circuit of the liquid-liquid heat exchanger may be water or a liquid comprising mostly water. The coolant passed through the at least one heat conducting body may have a boiling point under standard conditions that is below the boiling point of the liquid passed through a second coolant circuit of the liquid-liquid heat exchanger, preferably at least 20 K, more preferably at least 30 K, and most preferably at least 40 K below the boiling point of the liquid.

The condensation zone, into which the at least one coolant return line opens, can have a gradient, with a coolant collection tank, from which the coolant is fed to the coolant inlet via a coolant supply line, being arranged below all the heat conducting bodies.

The coolant may be or comprise a perfluorinated chemical compound, preferably a compound derived from ethyl isopropyl ketone, particularly preferably perfluoro(2-methyl-3-pentanone), $C_6F_{12}O$.

The coolant return may have a vertical opening cross-section larger than a maximum opening cross-section of the coolant inlet.

The coolant return can be pressure-free so that the coolant can drain off unhindered via the coolant return.

The coolant return can be arranged at a distance from a lower boundary wall of the cavity, wherein a filling level of the coolant in the cavity above the lower boundary wall is predetermined by the distance, and wherein an evaporation volume of the cavity is determined by a further distance of the coolant return from an upper boundary wall arranged opposite the lower boundary wall.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 4A:
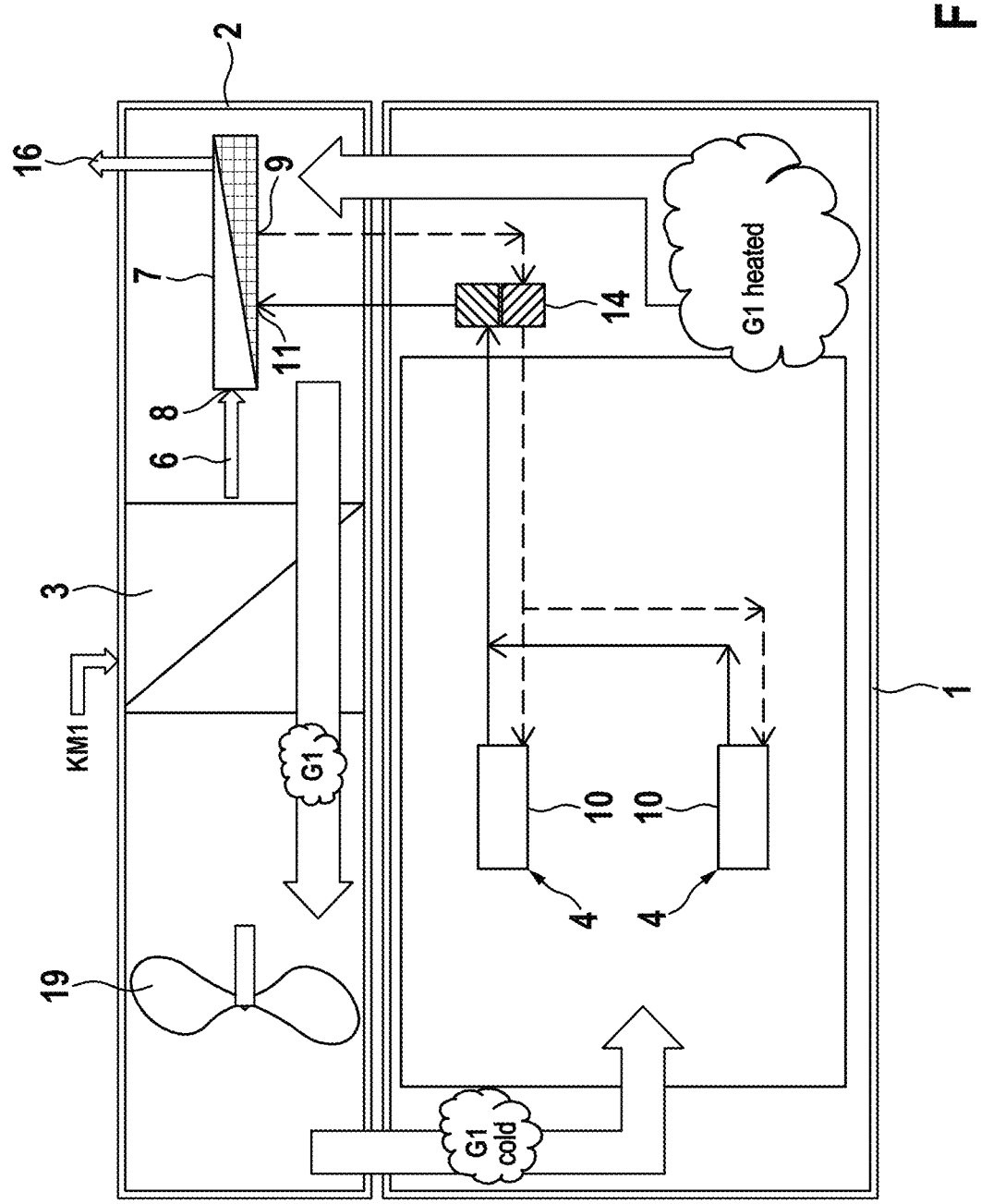
Figure 4B:
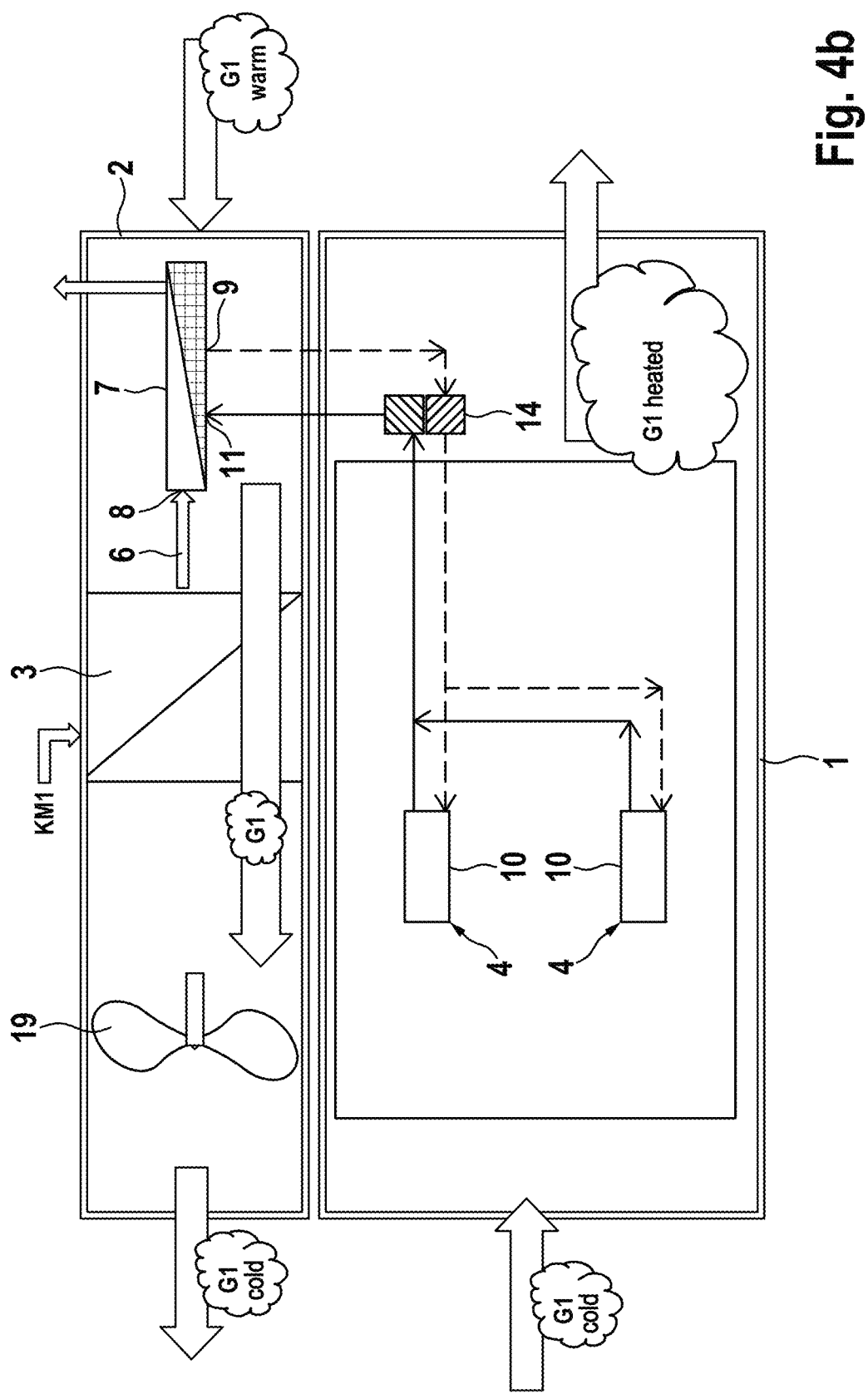
Figure 4C:
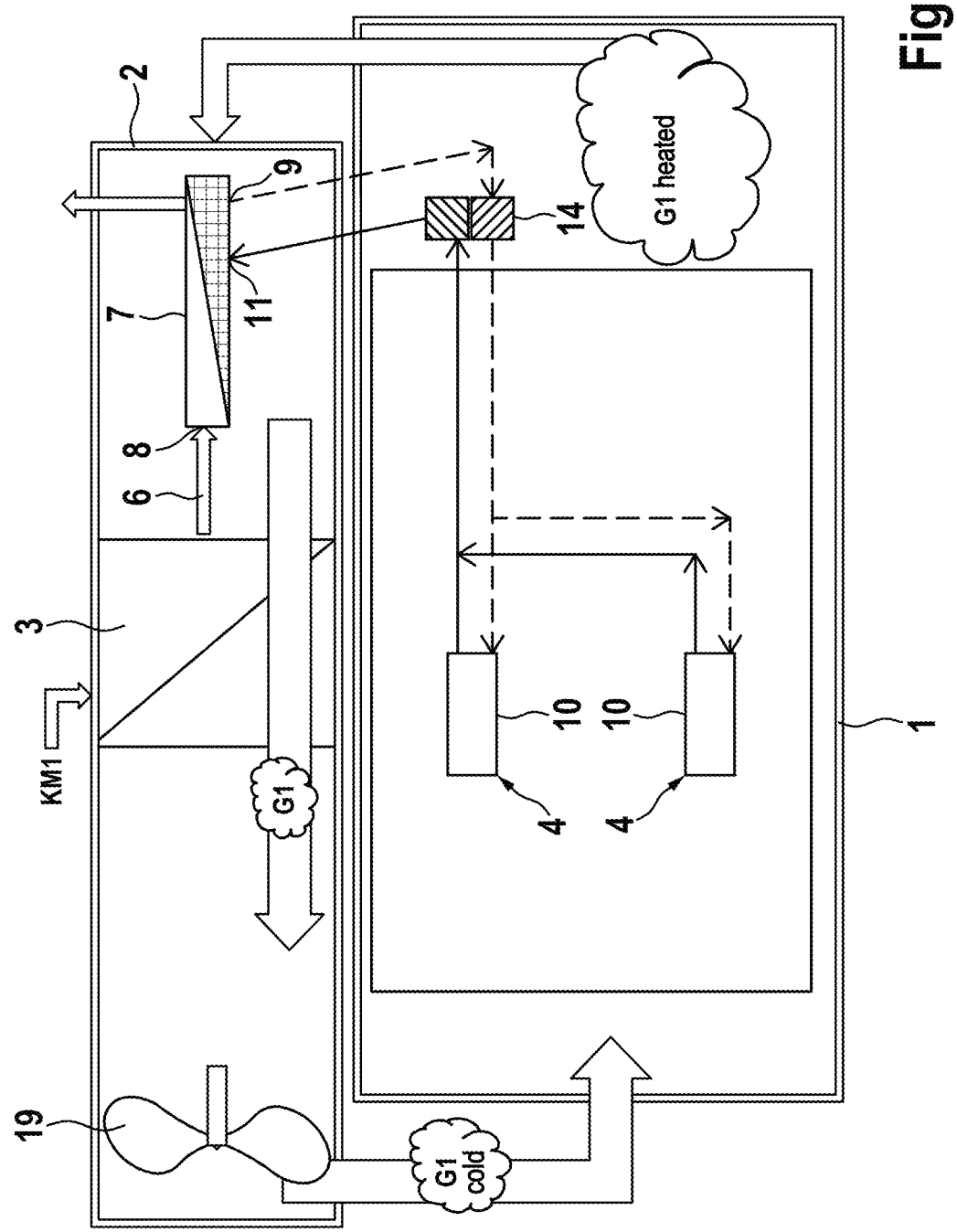
Figure 5:
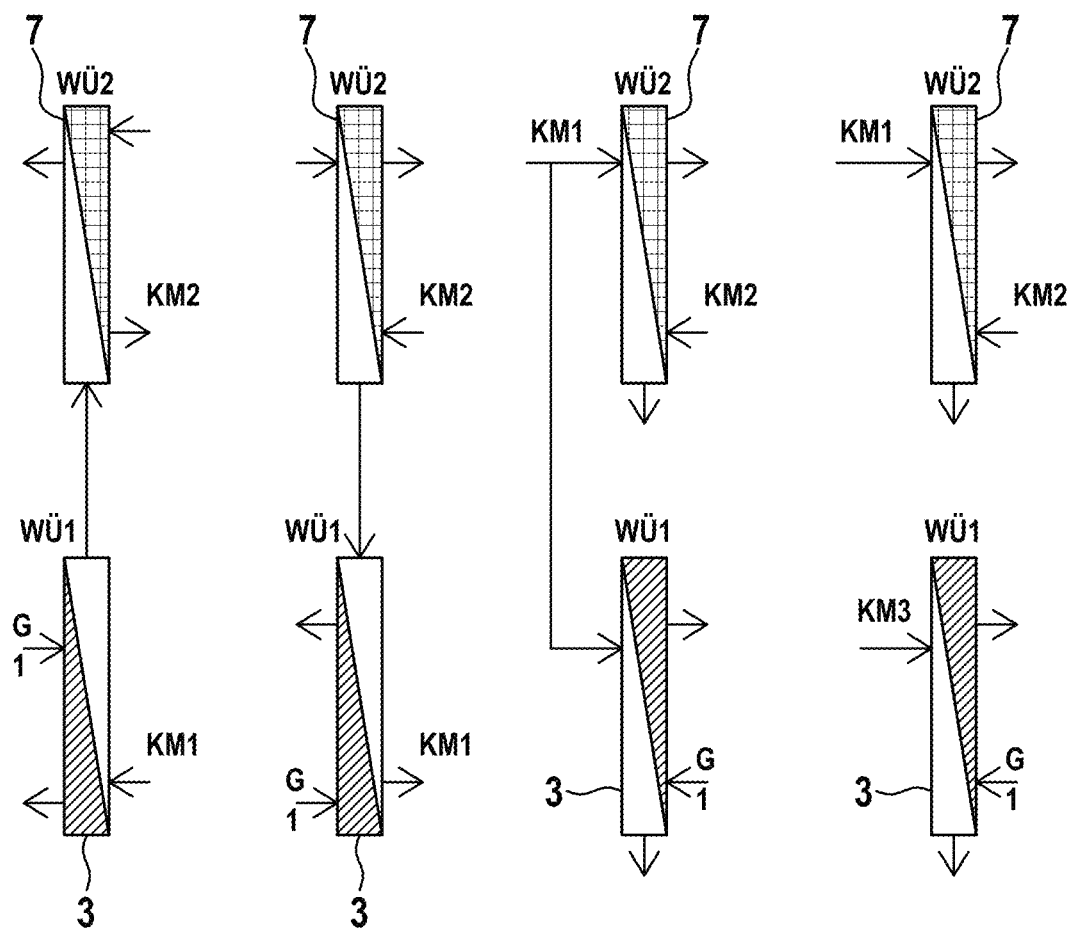
Figure 6:
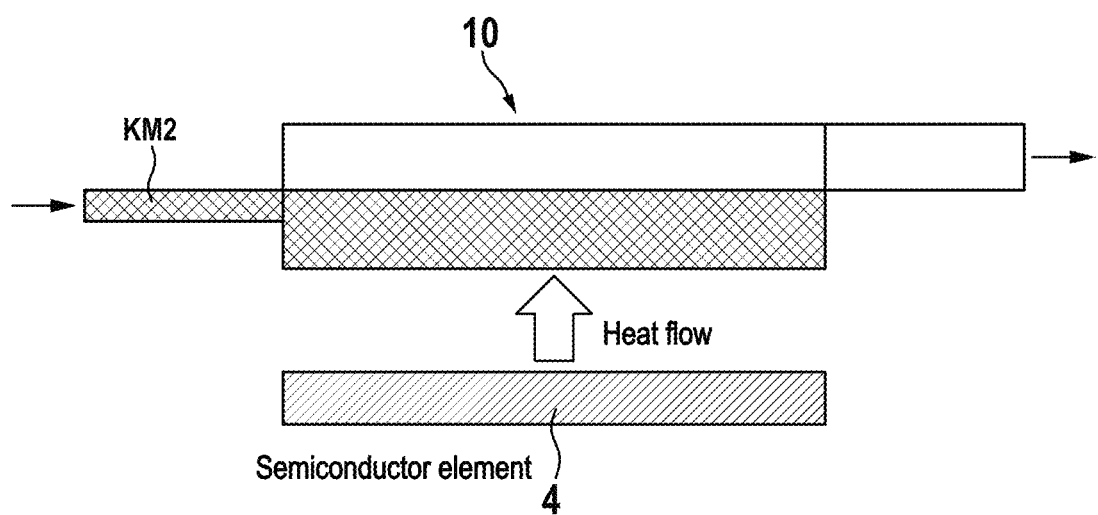
Figure 7:
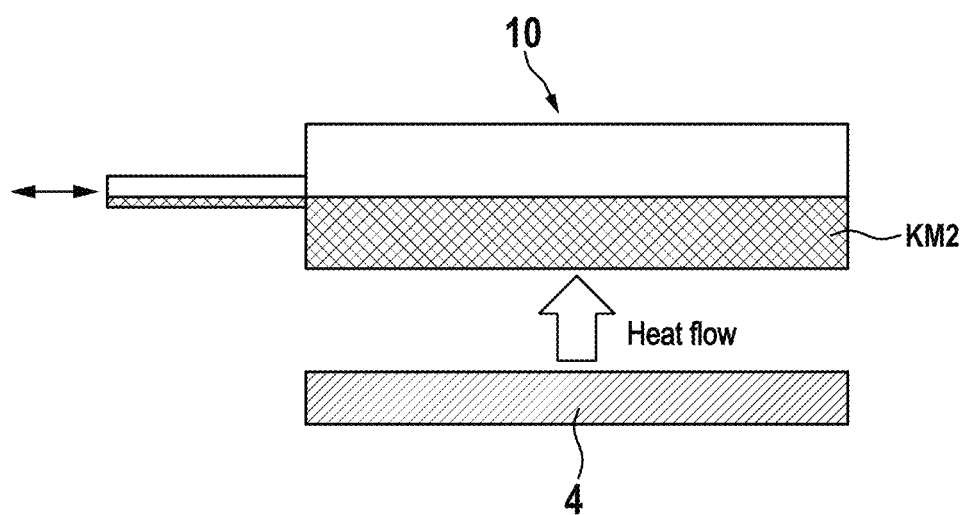
Figure 8:
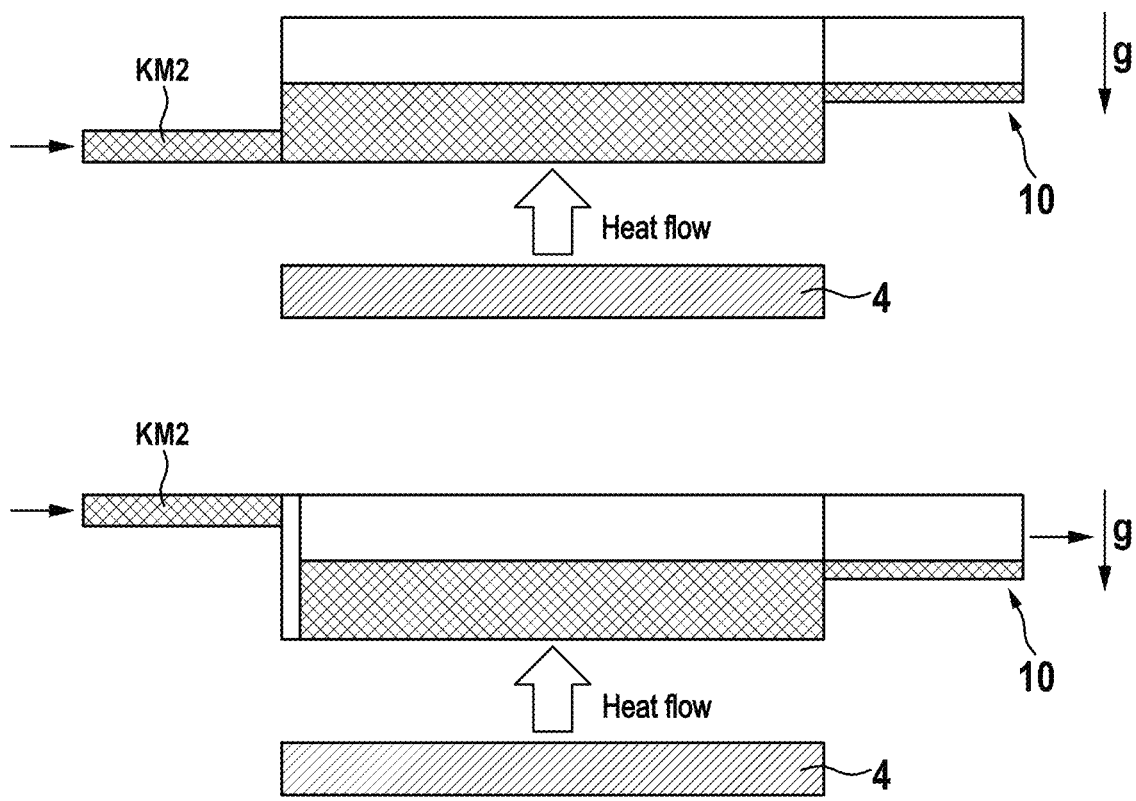
Figure 9:
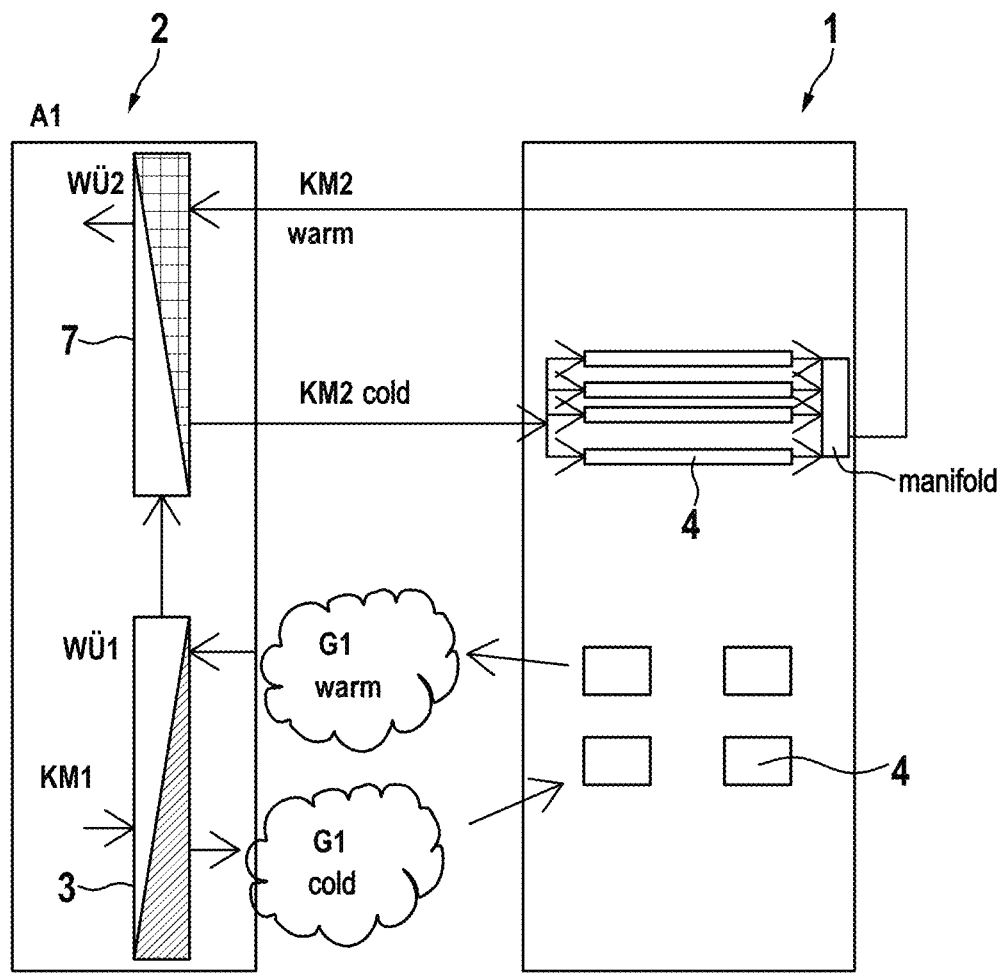
Figure 10:
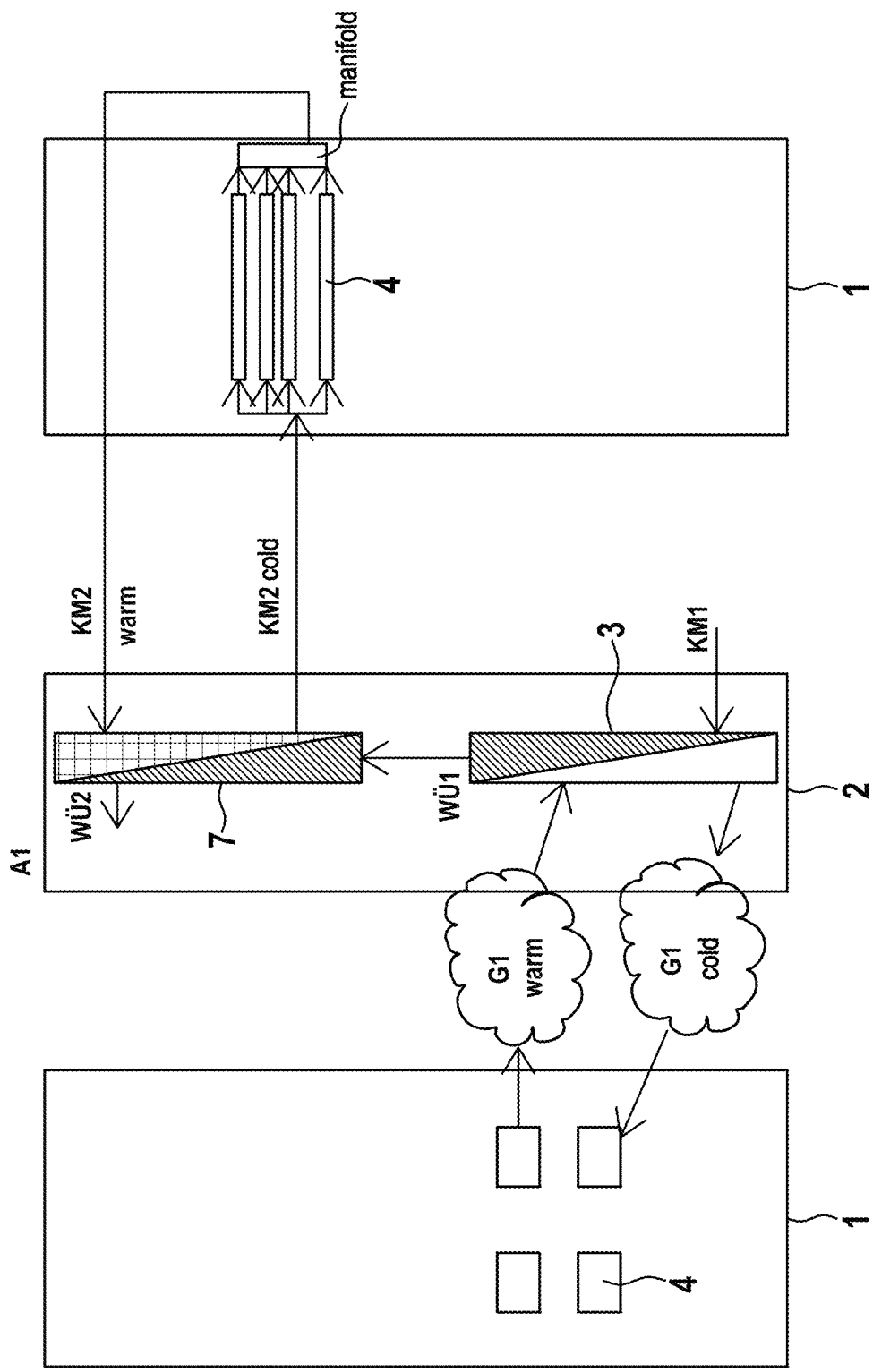
Figure 11:
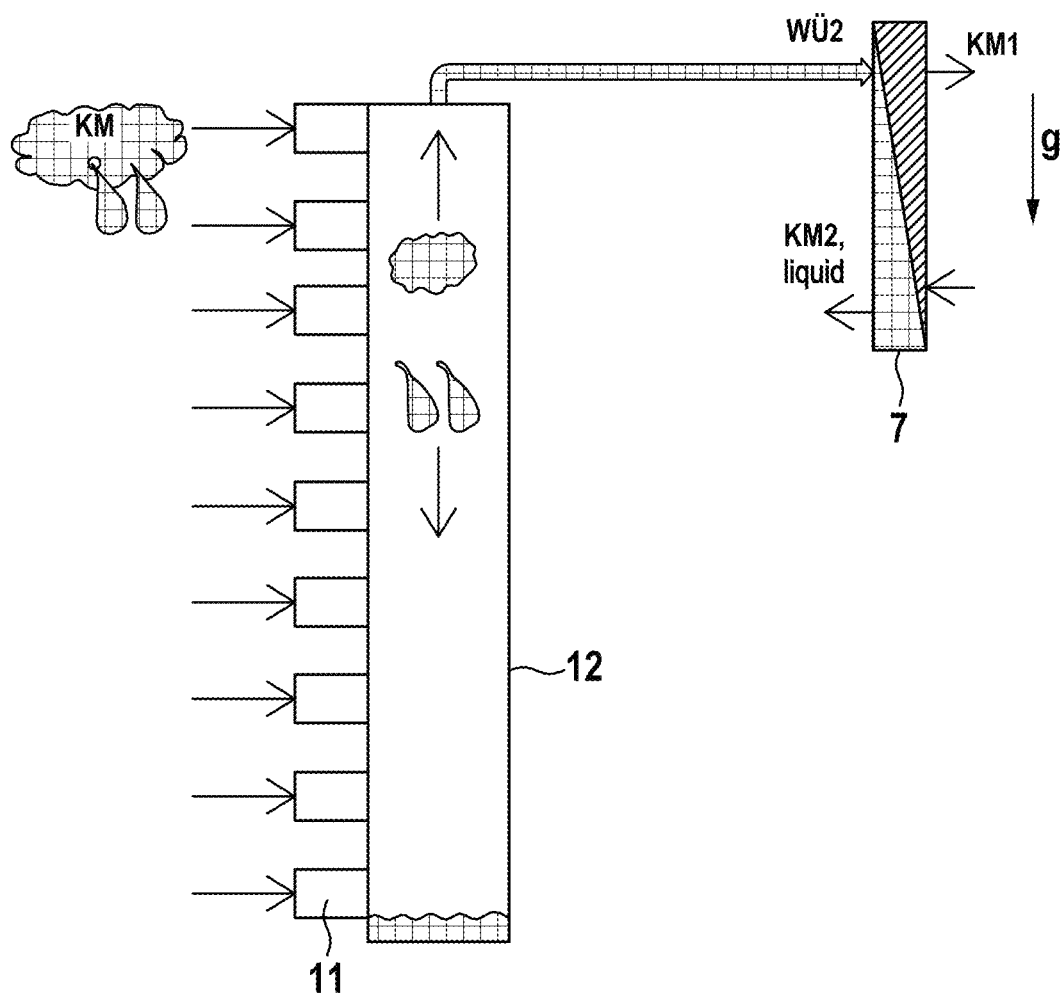
Figure 12:
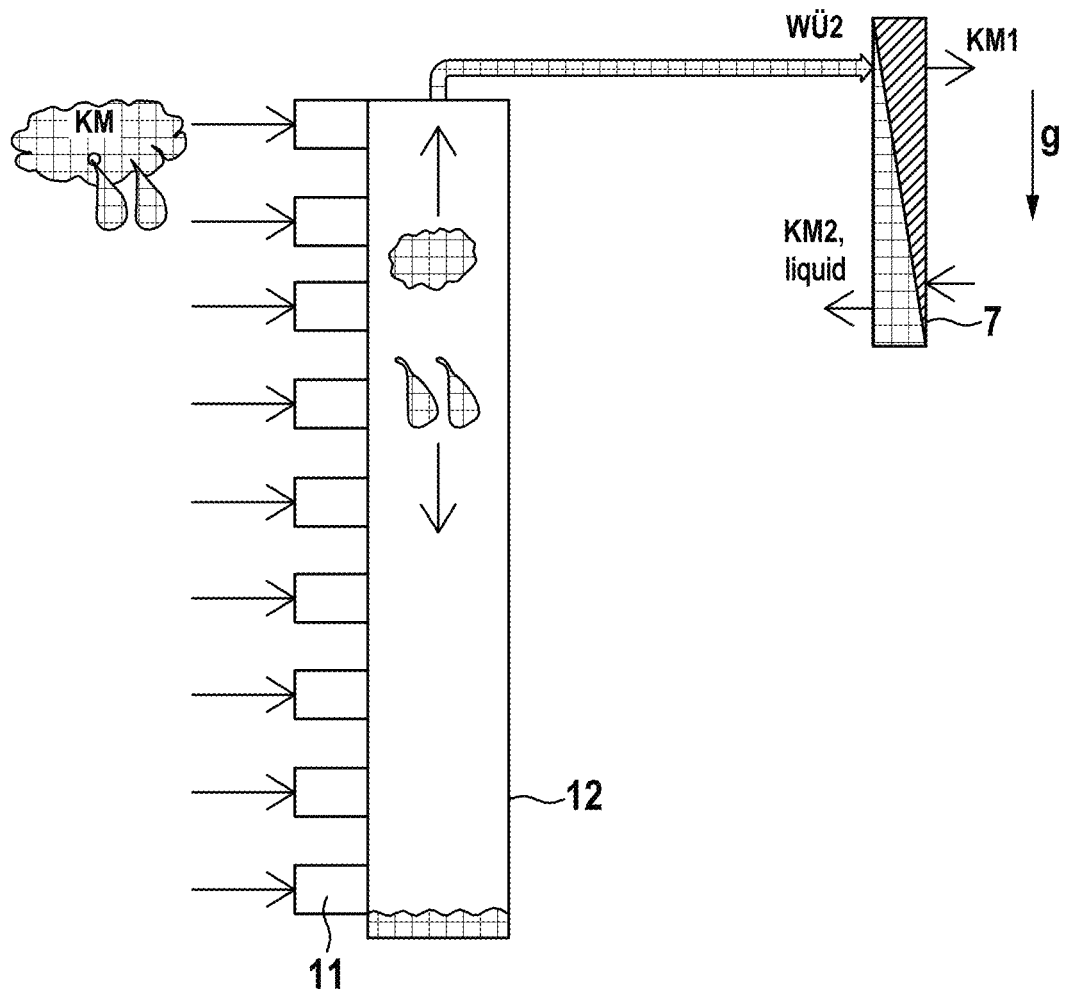
Figure 13:
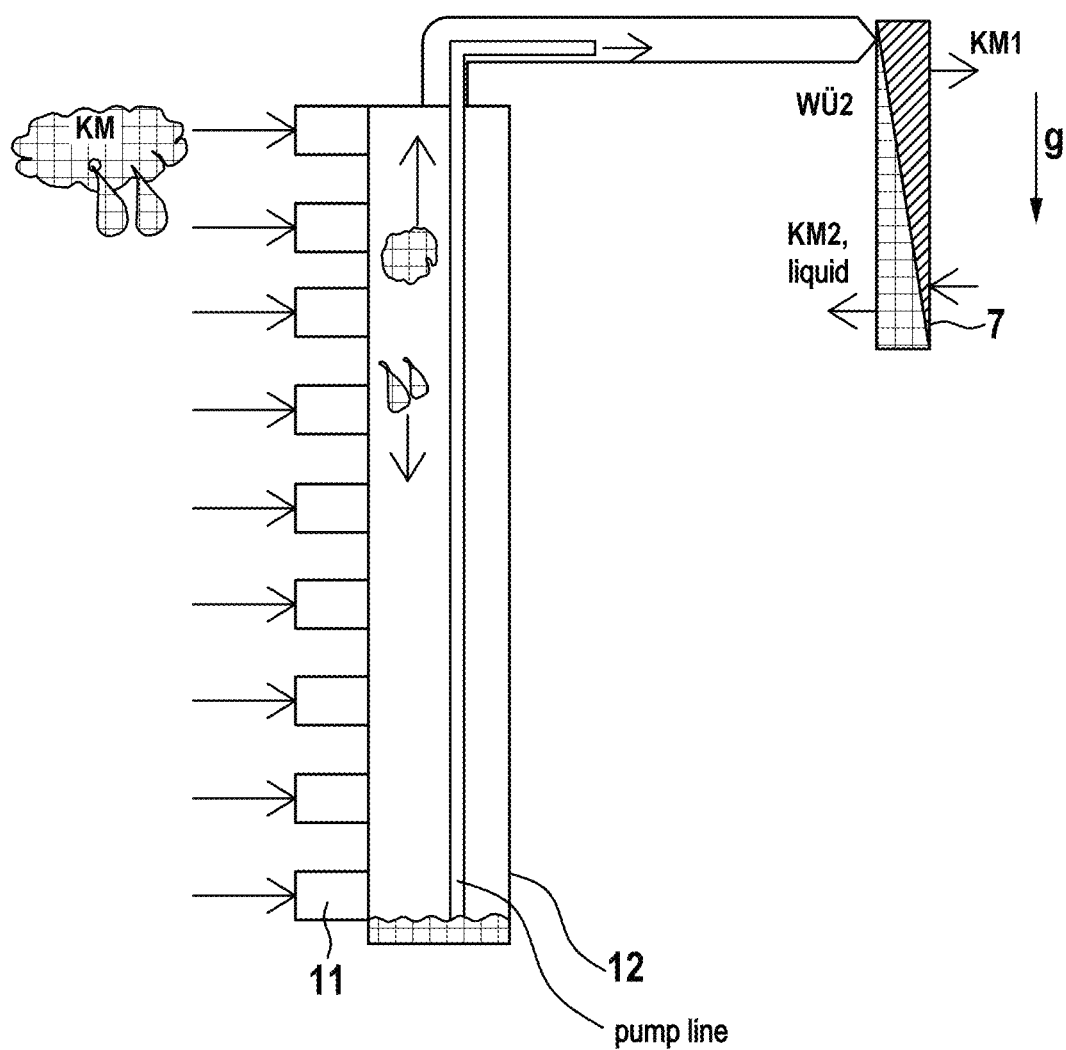
Figure 14:
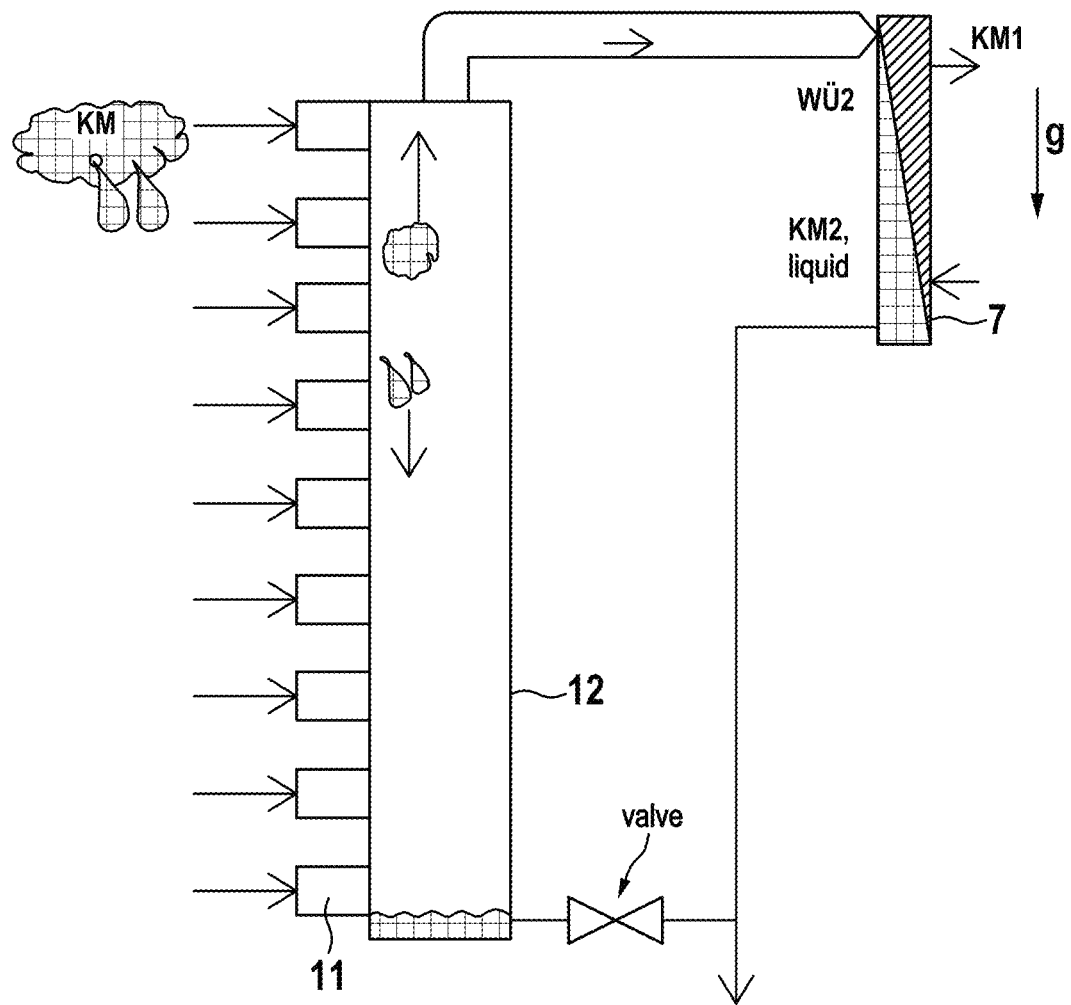
Figure 15:
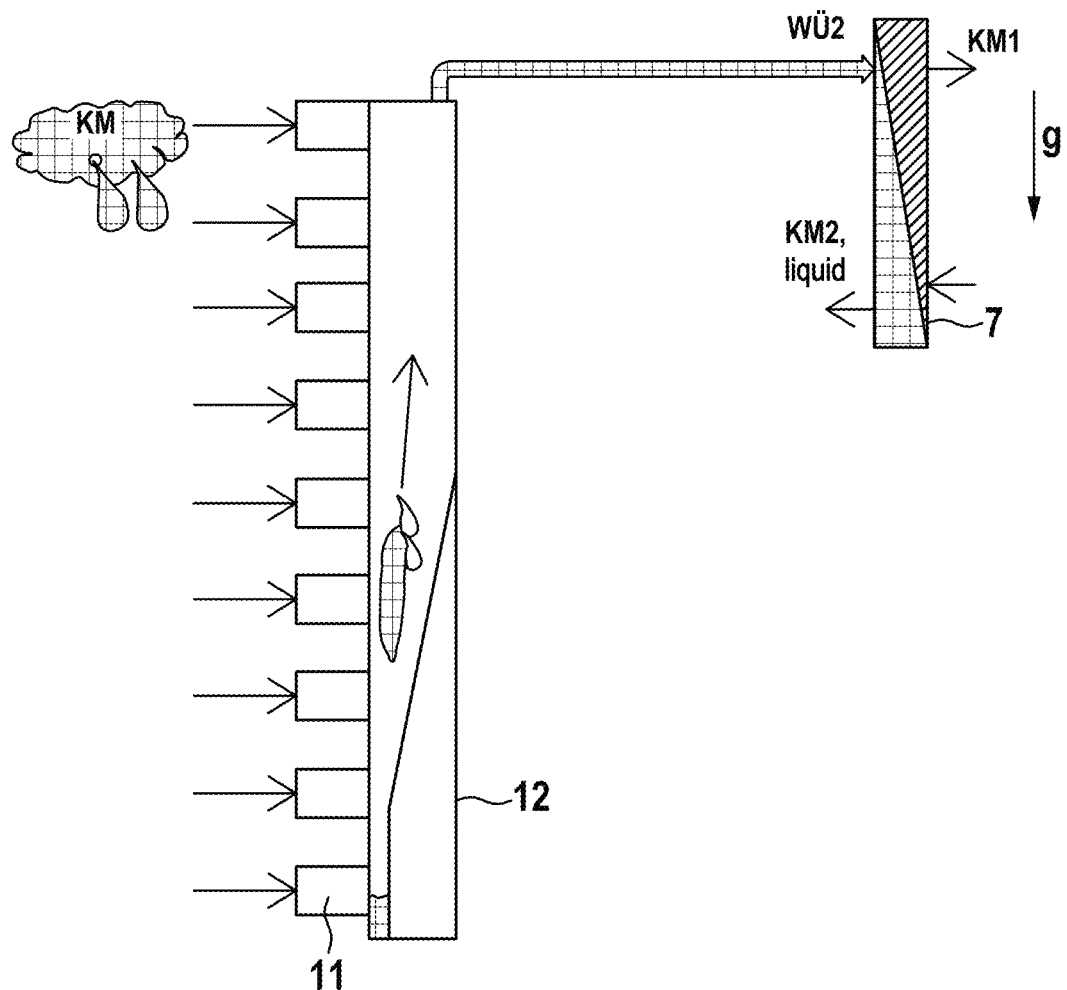
Figure 16:
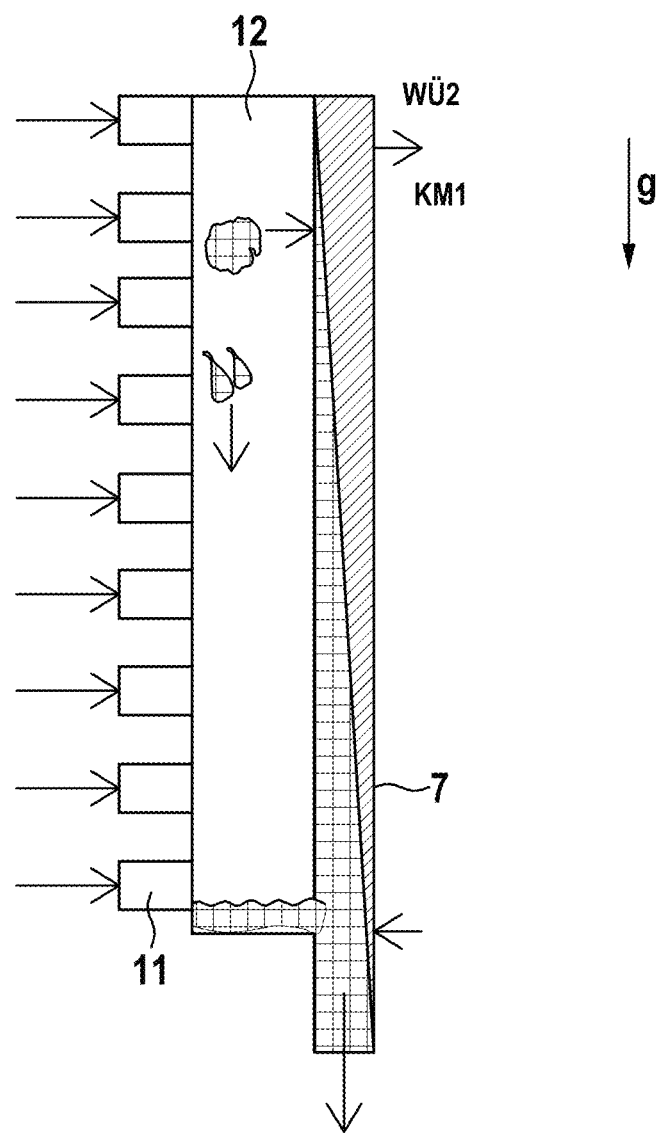
Figure 17:
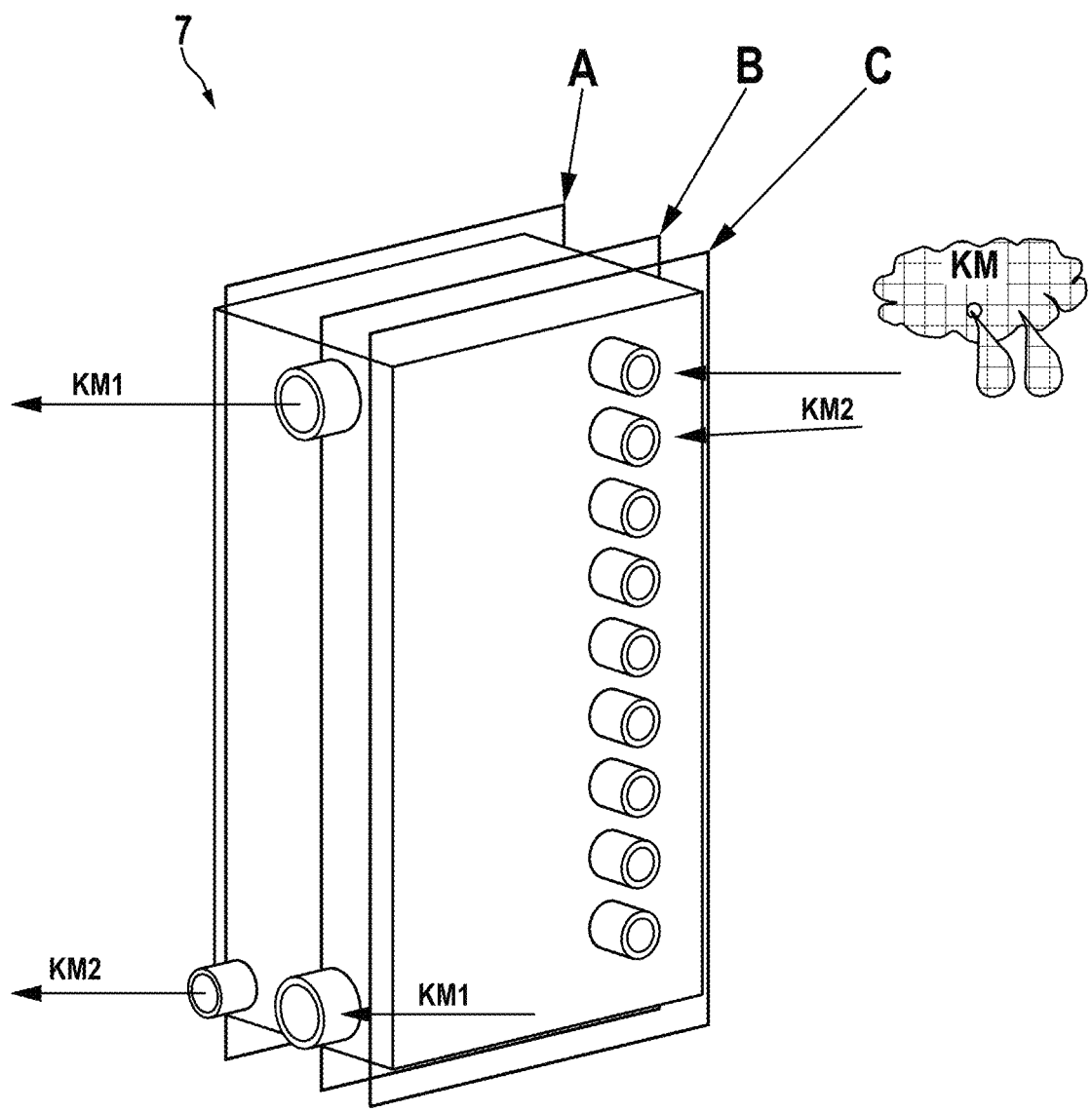
Figure 18:
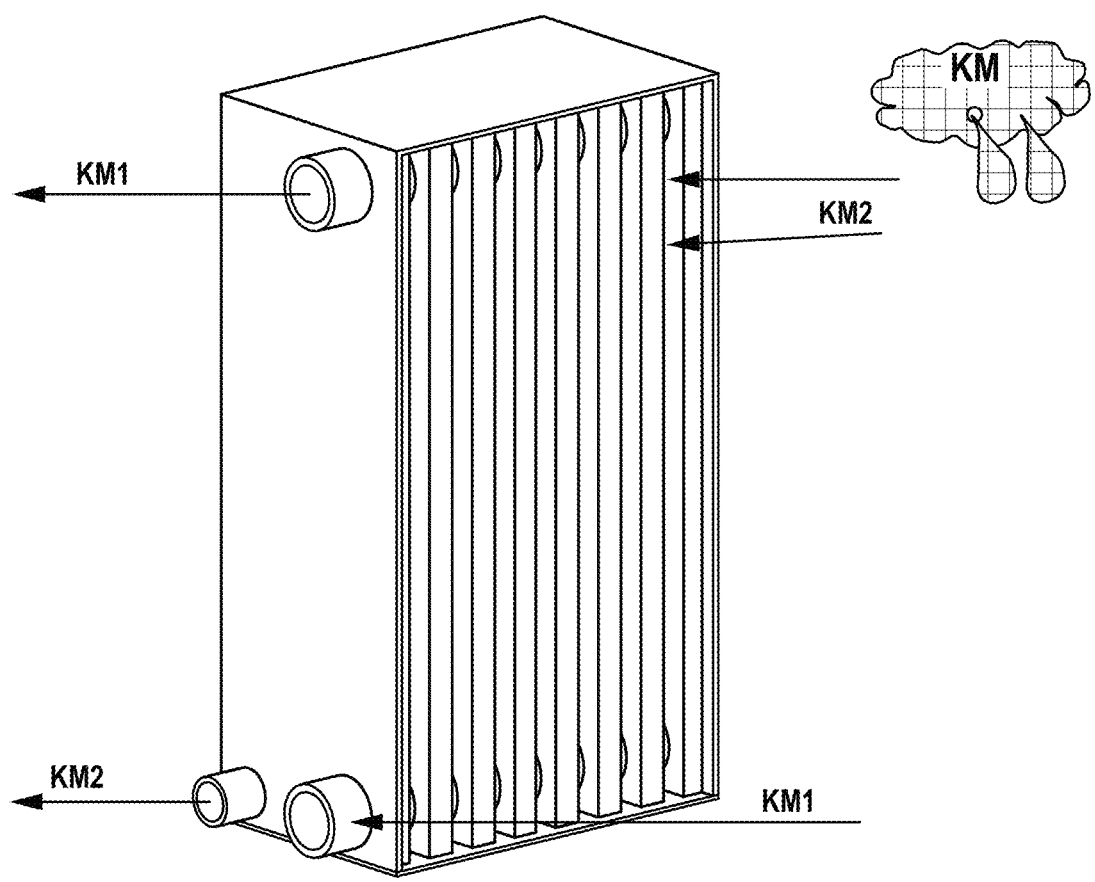
Figure 19:
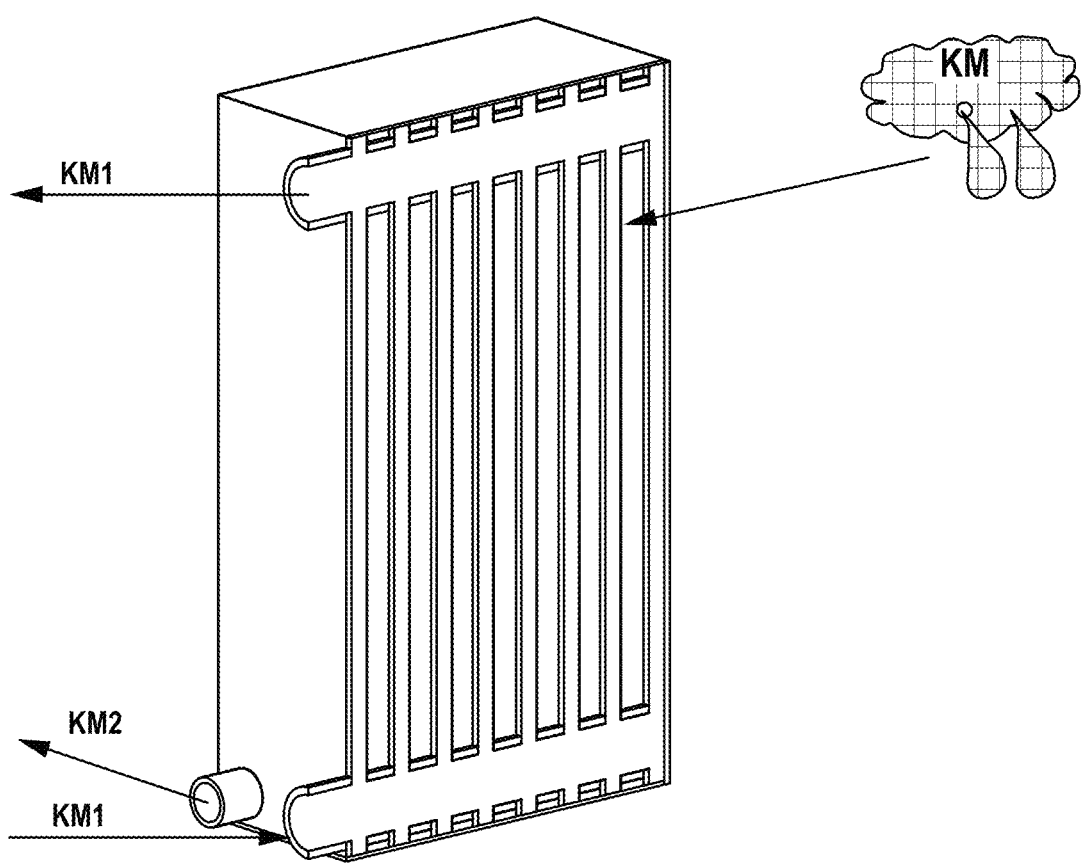
Figure 20:
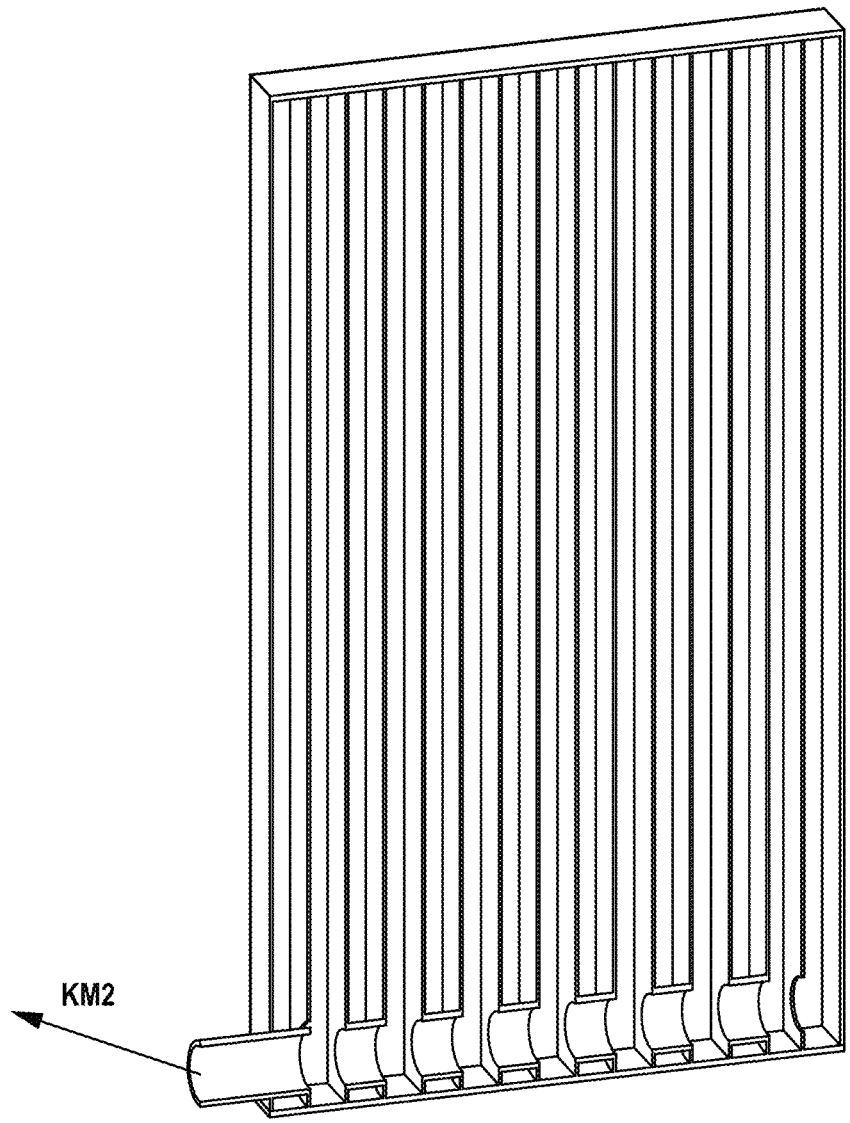

Further details of the invention are explained with reference to the figures below. These show only exemplary embodiments which are not intended to limit the invention. Thereby shows:

FIG. 1 a switch cabinet arrangement according to the state of the art;

FIG. 2 an exemplary embodiment of a switch cabinet arrangement according to the invention;

FIG. 3 a further embodiment of a switch cabinet arrangement according to the invention;

FIG. 4a-4c three exemplary embodiments of a switch cabinet arrangement according to the invention with different relative arrangement of the cooling unit to the switch cabinet housing;

FIG. 5 schematically, different variants of the interconnection of an air-liquid heat exchanger with a liquid-liquid heat exchanger;

FIG. 6 schematically, the heat transfer between a component to be cooled and a heat conducting body according to a first embodiment;

FIG. 7 schematically, the heat transfer between a component to be cooled and a heat conducting body according to a second embodiment;

FIG. 8 schematically, the heat transfer between a component to be cooled and a heat conducting body according to a third embodiment;

FIG. 9 in schematic representation, a further embodiment of the switch cabinet arrangement according to the invention;

FIG. 10 in schematic representation, a further embodiment of a switch cabinet arrangement according to the invention;

FIG. 11 in schematic representation, an exemplary embodiment of a manifold;

FIG. 12 in schematic representation, further embodiments of a manifold;

FIG. 13 in schematic representation, another embodiment of a manifold;

FIG. 14 in schematic representation, a further embodiment of a manifold;

FIG. 15 in schematic representation, a further embodiment of a manifold;

FIG. 16 in schematic representation, a further embodiment of a manifold;

FIG. 17 an exemplary embodiment of a liquid-liquid heat exchanger in perspective, FIG. 18 a perspective view of the heat exchanger according to FIG. 17 looking at the sectional plane C;

FIG. 19 the heat exchanger according to FIG. 17 with a view of the sectional plane B; and FIG. 20 the heat exchanger according to FIG. 17 with a view of the sectional plane A.

Figure 21:
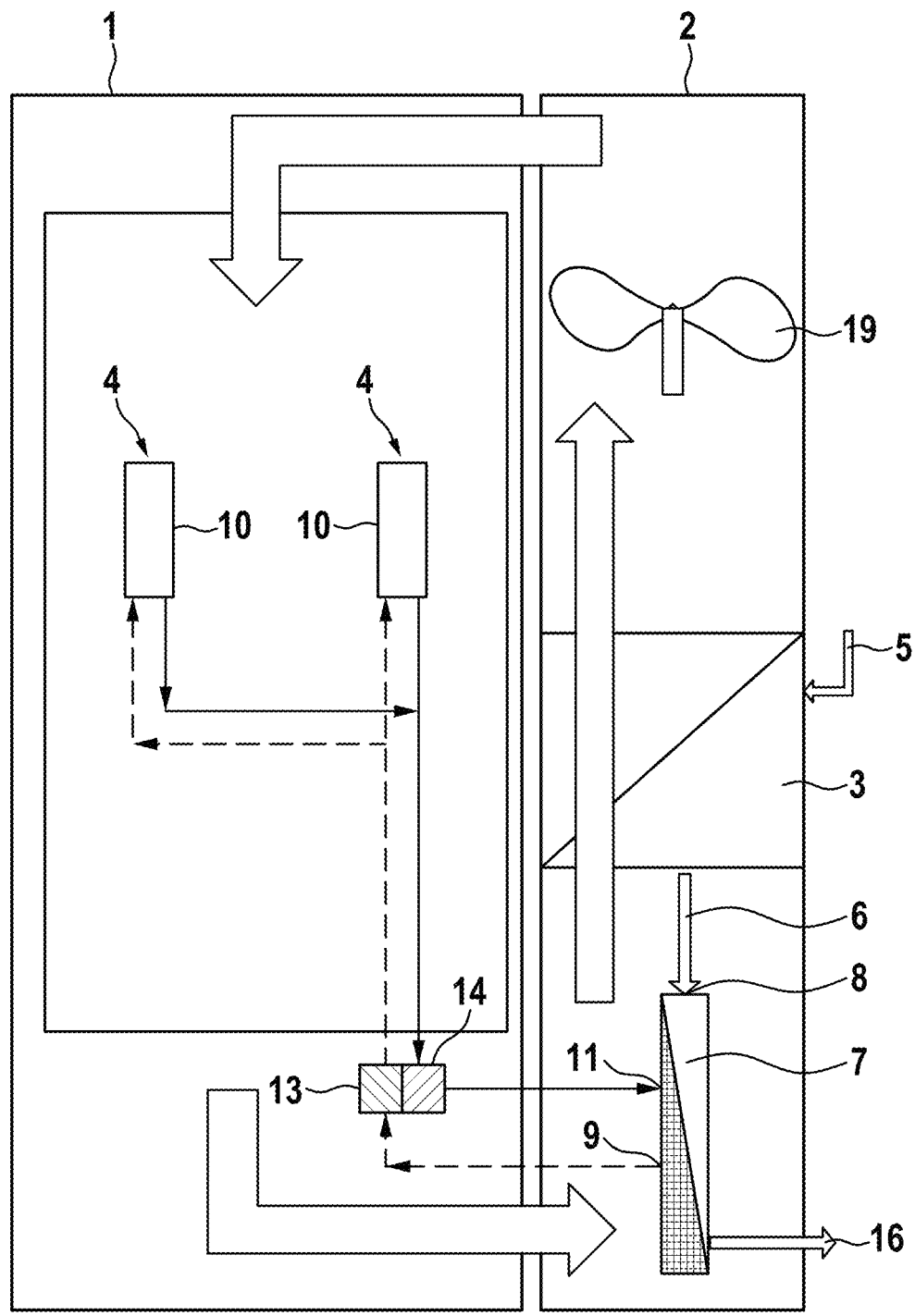
Figure 22:
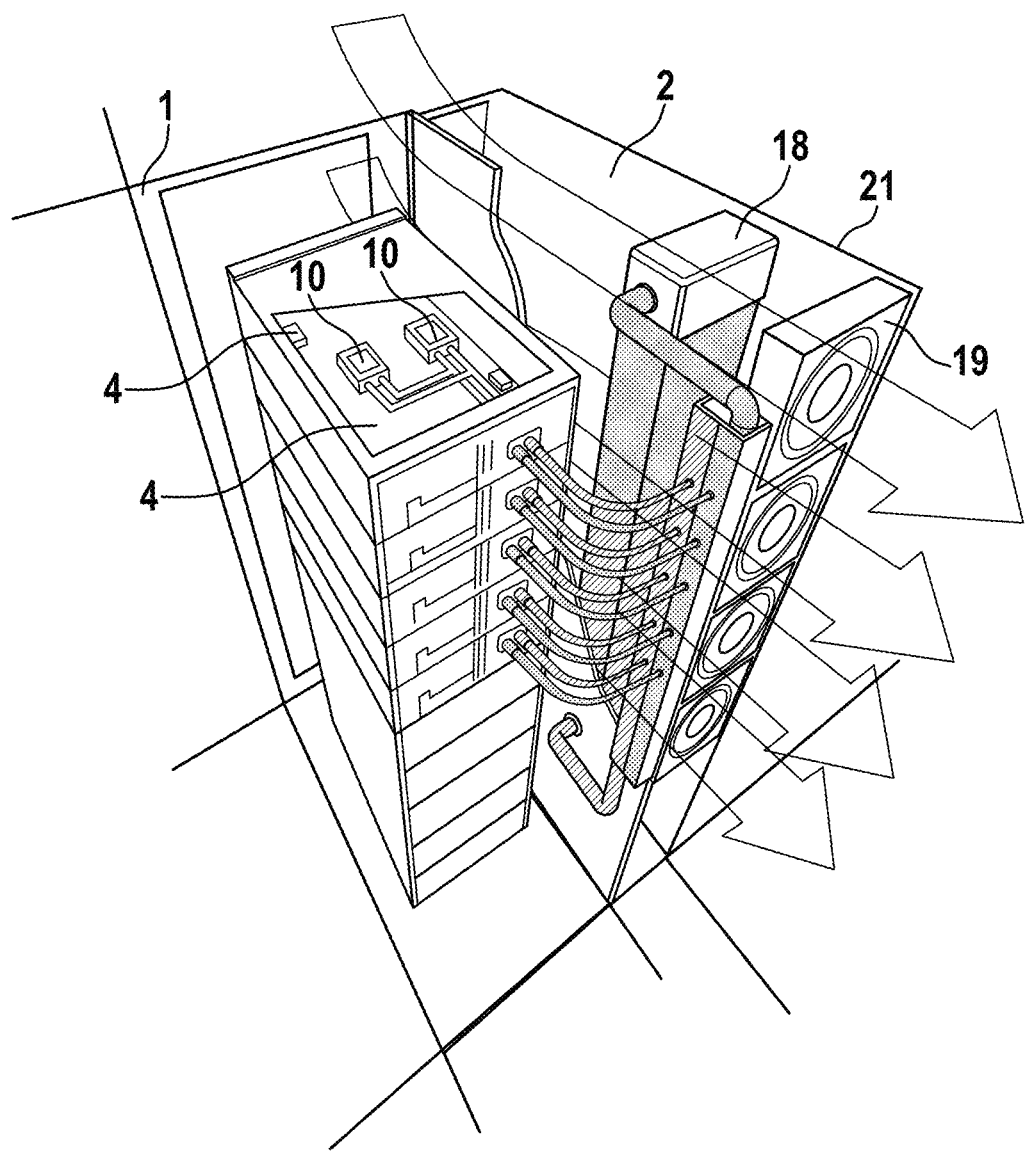
Figure 23:
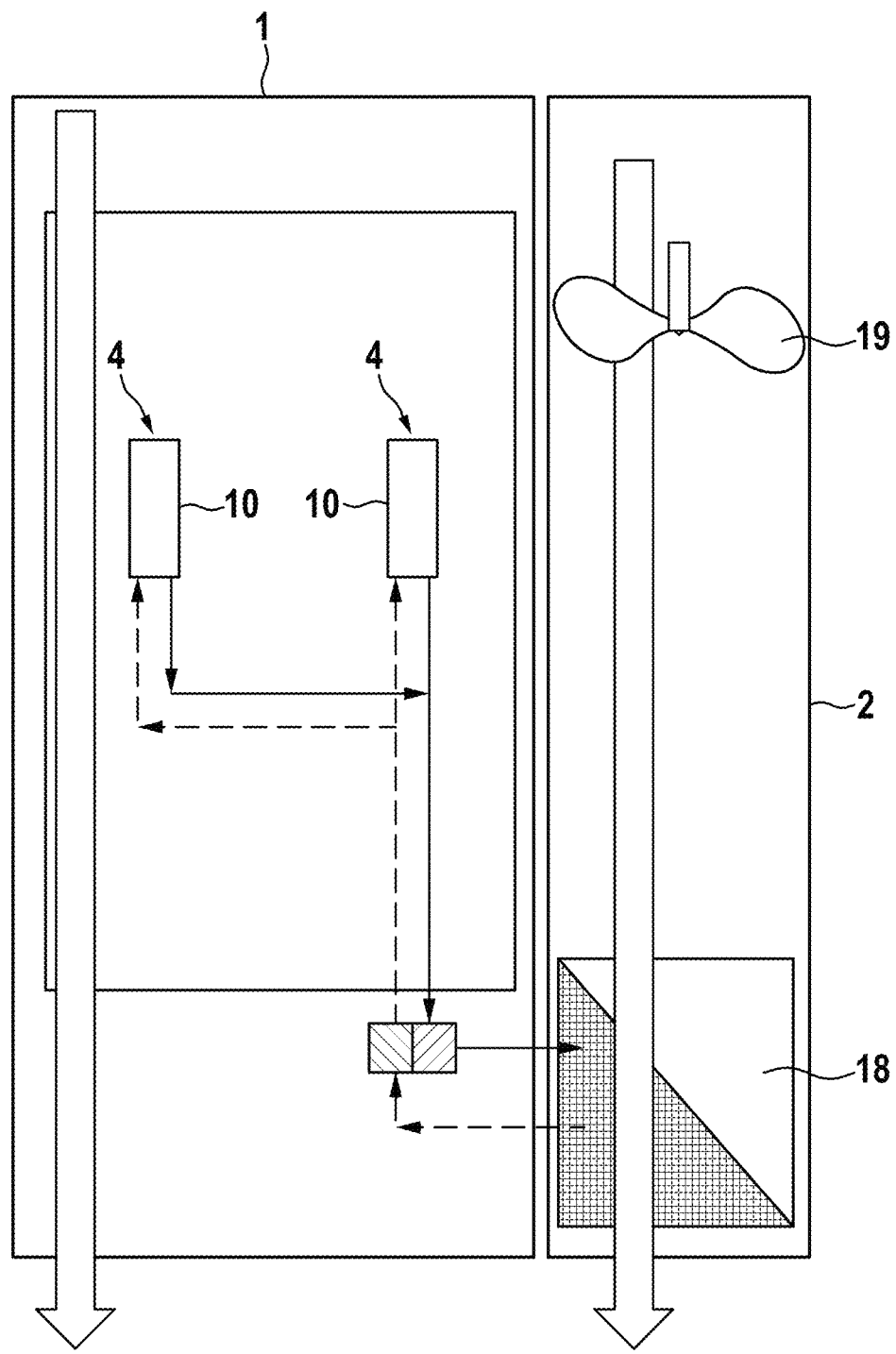
Figure 24:
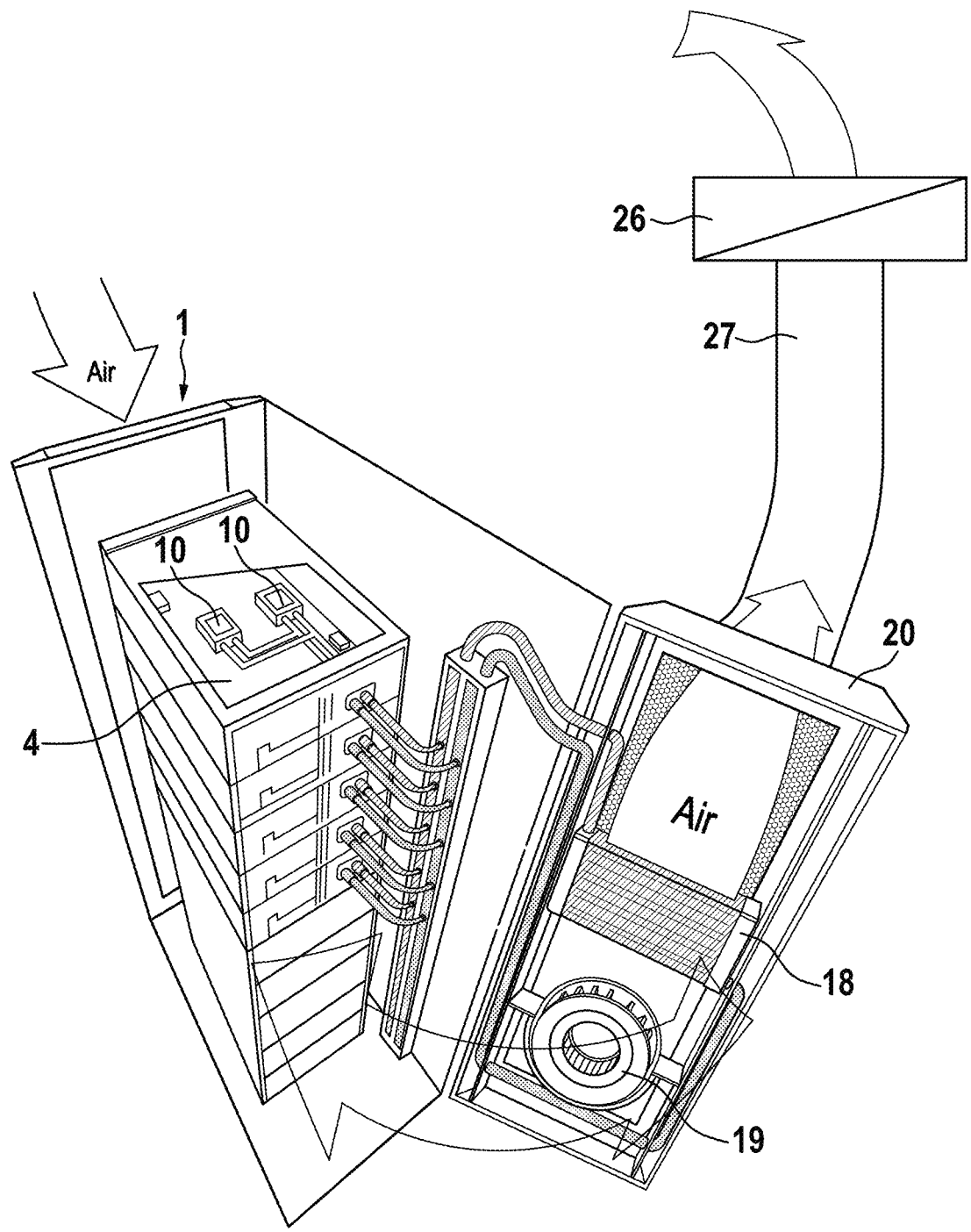
Figure 25:
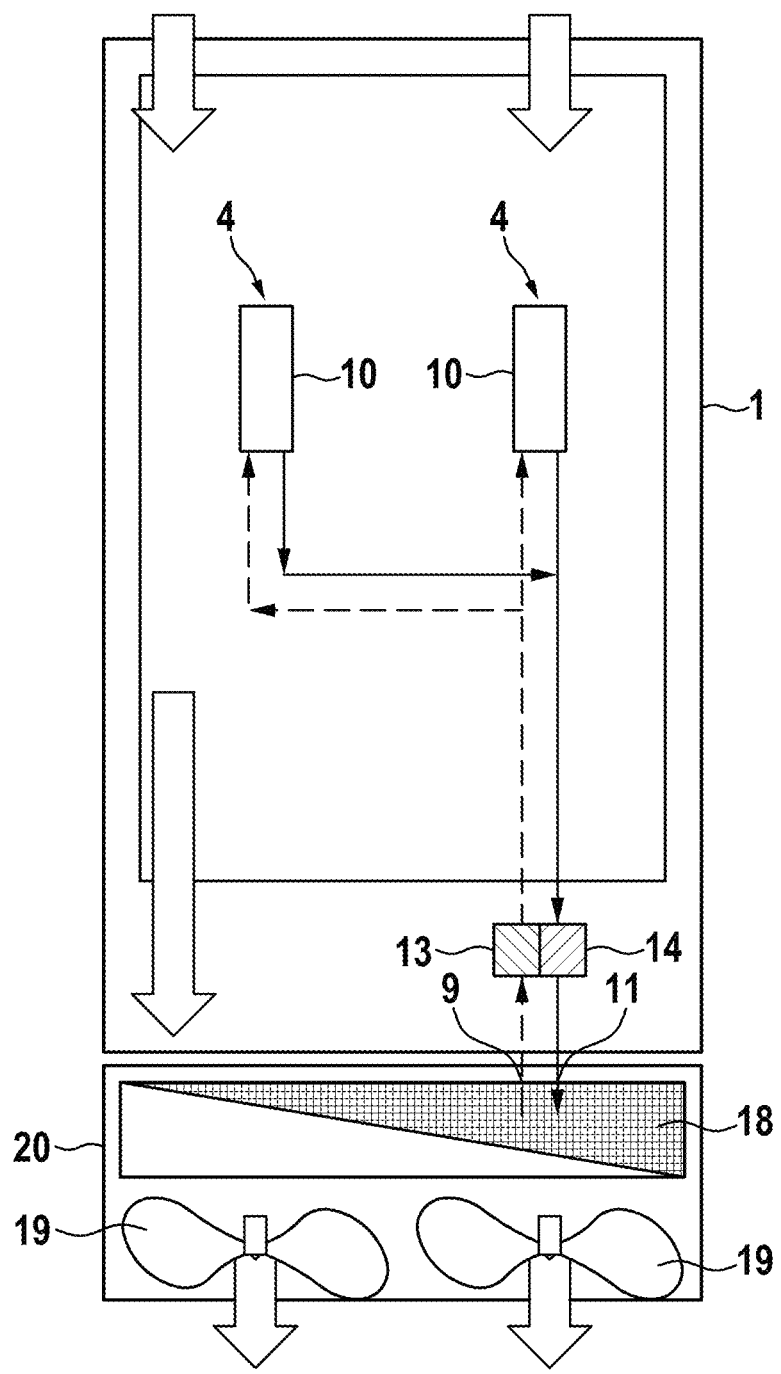
Figure 26:
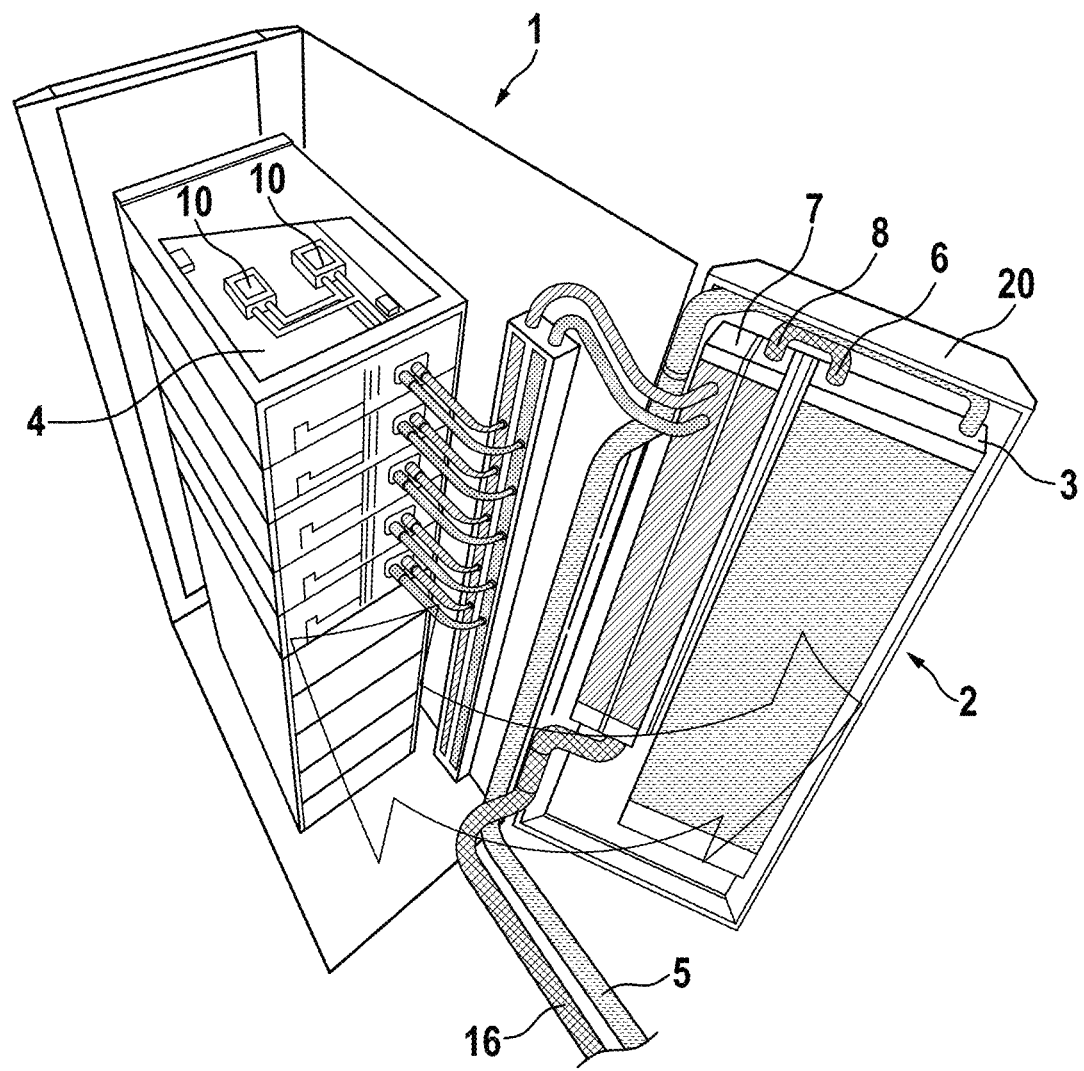
Figure 27:
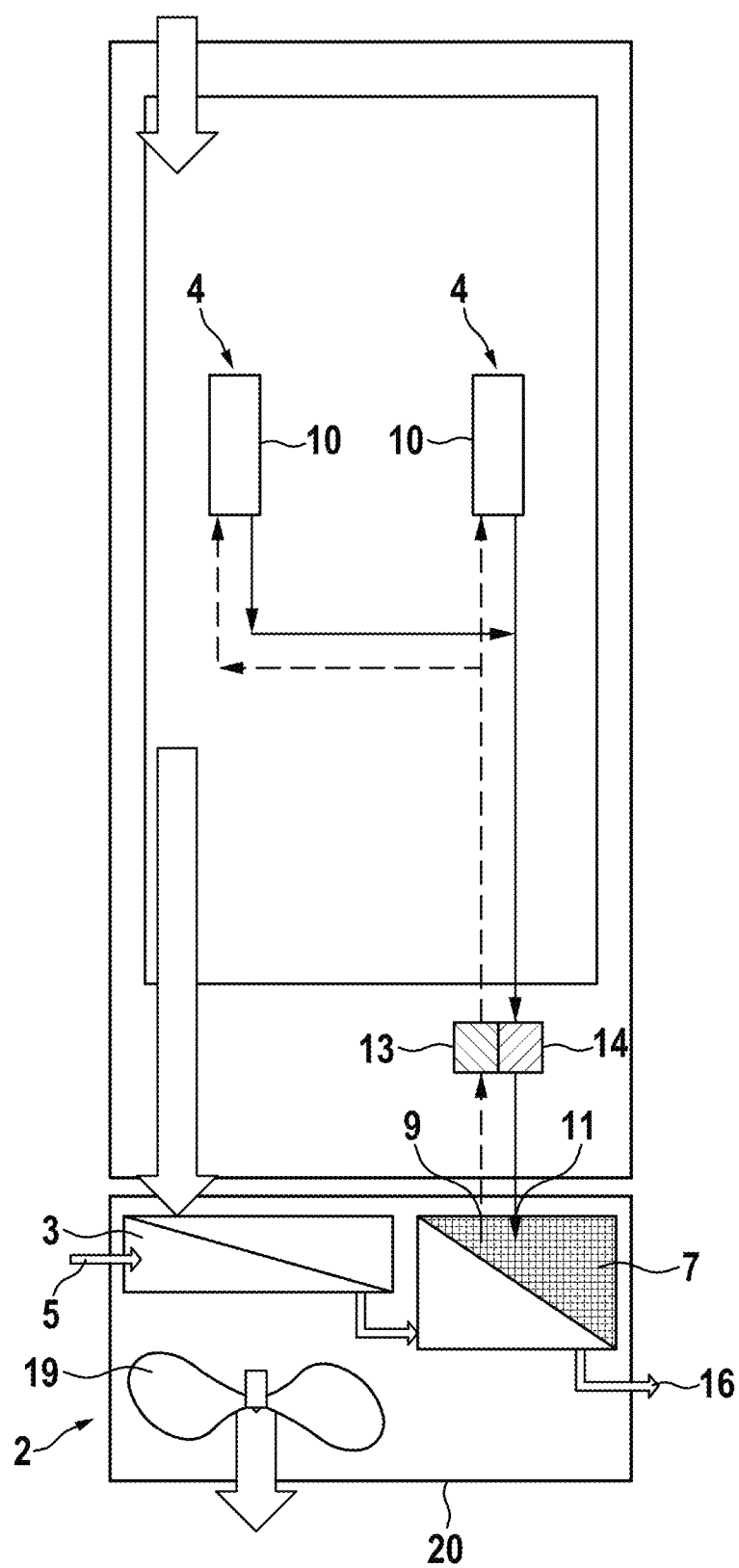

FIG. 21 in schematic illustration, the fluid flows of the embodiment according to FIG. 3;

FIG. 22 another embodiment of a switch cabinet arrangement according to the invention;

FIG. 23 in schematic representation, an illustration of the fluid flows of the embodiment according to FIG. 23;

FIG. 24 another embodiment of a switch cabinet arrangement according to the invention;

FIG. 25 in schematic representation, an illustration of the fluid flows of the embodiment according to FIG. 24;

FIG. 26 a further embodiment of a switch cabinet arrangement according to the invention; and FIG. 27 in schematic representation, an illustration of the fluid flows of the embodiment according to FIG. 26.

DETAILED DESCRIPTION

Example embodiments will now be described more fully with reference to the accompanying drawings.

FIG. 1 shows a switch cabinet arrangement according to the state of the art. A first cooled liquid, in this case water, is provided via a recooler 15 arranged outside a building, for example a data center, which can be designed, for example, as a chiller, and is made available to a cooling unit 2 arranged in the data center. The cooling unit 2 has an air-liquid heat exchanger 3, via which cooling air is provided, which is blown into a raised floor of the data center. From the raised floor, the cooling air is blown in front of the enclosures or IT racks 1 so that the cooling air can be drawn in by components arranged therein, for example server racks. Alternatively or additionally, the switch cabinets 1 can form a row of switch cabinets separating a hot aisle from a cold aisle of the data center, whereby a cold air overpressure is provided in the cold aisle via fans arranged in the raised floors, which transports the cooling air through the cabinets 1 into the hot aisle as heated air and thereby cools the components arranged in the cabinets 1.

In addition to the air cooling, liquid cooling is provided, for example CPU liquid cooling, for which purpose a further recooler 15 is provided which liquefies a refrigerant which may, for example, have a boiling temperature which may be close to a preferred operating temperature of components requiring cooling. Thus, when the refrigerant is supplied to the components requiring cooling, the power dissipation generated by them can lead to evaporation of the refrigerant so that, due to the phase transition from liquid to gas, there is a particularly high heat transfer from the component to the refrigerant and thus effective cooling. The heat transfer from the refrigerant to the components is promoted by means of heat conducting bodies 10, which are in direct contact with the component to be cooled. The heat conducting bodies 10 can essentially consist of a material with very good thermal conductivity, for example a metal, which forms a heat conducting body through which the refrigerant is passed and which, if necessary, undergoes the phase transition from liquid to gaseous described above within the heat conducting body 10, the refrigerant preferably being provided at a flow rate or with a flow volume and a temperature which are selected in such a way that only a partial quantity of the refrigerant volume flow passed through evaporates and a further part remains liquid, so that the evaporated part can be transported out by the liquid part of the refrigerant flowing in order to be liquefied again in the recooler 15.

In contrast, FIGS. 3 to 5 show exemplary embodiments of a switch cabinet arrangement according to the invention. In this arrangement, a first cooled liquid, for example water, is supplied to the cooling unit 2 via a first flow 5, with which liquid flowing through the heat exchanger 3. For this purpose, the heat exchanger 3 has a first return 6, which now, in deviation from the solution according to FIG. 1, does not open directly into the recooler 15, but is connected to a supply 8 of a liquid-liquid heat exchanger 7. The heat exchanger 7 has a second return 16, which is fed to a recooler 15 analogously to the embodiment according to FIG. 1. Via the liquid-liquid heat exchanger 7, a heat transfer takes place between the liquid circuit of the air-liquid heat exchanger and a second refrigerant circuit fluidically separated therefrom, which may, for example, have a refrigerant with a different boiling point, as has already been described with reference to FIG. 1. Since the second refrigerant circuit can be operated at a temperature level which is above that of the first refrigerant circuit with the air-liquid heat exchanger 3, the heated liquid provided via the first return 6 can serve as a cooling liquid which is introduced into the liquid-liquid heat exchanger 7.

FIGS. 4a to 4c show three different relative arrangements of a cooling unit housing 2 with respect to a switch cabinet housing 1. The differing relative arrangement of the two components 1, 2 with respect to one another results in a different air flow. In particular, therefore, according to the invention, both embodiments are conceivable in which the air cooled via the air-refrigerant heat exchanger 3 and flowing over the components 4 requiring cooling merely circulates between the cooling device and the switch cabinet housing, i.e. fluidically separated from the environment of the switch cabinet arrangement, forming a closed air circuit. On the other hand, there are arrangements in which fundamentally different air flows flow through the switch cabinet housing 1 on the one hand and the cooling unit 2 on the other, whereby these arrangements are used in particular in so-called cold aisle-hot aisle constellations in data centers and the like.

In detail, FIG. 4 a shows an arrangement in which the air circulates exclusively between the directly adjacent and fluidically interconnected housings of cooling unit 2 and switch cabinet 1. The air cooled via the air-refrigerant heat exchanger 3 is drawn through the heat exchanger 3 by a fan 19 and forced into the switch cabinet housing 1, for which purpose it is blown laterally into the switch cabinet housing 1 at a rear side of the switch cabinet housing 1. The cooling air flows through the switch cabinet housing 1 in a substantially horizontal direction, flowing around the components 10 requiring cooling, whereupon it enters the cooling unit 2 at the front of the switch cabinet housing 1 as heated air again via a lateral, fluidic air transition in order to flow through the air-refrigerant heat exchanger 3 again.

In the manner already described, the refrigerant return of the air-refrigerant heat exchanger 3 is connected to a flow 8 of the refrigerant-refrigerant heat exchanger 7, whereby the refrigerant leaving the air-refrigerant heat exchanger 3 as partially heated refrigerant KM1 after passing the liquid-liquid heat exchanger 7 leaves the latter via the return 16 in order to be recooled, for example, via an external recooler (compare FIG. 2). The refrigerant KM1 can be water, for example.

In contrast to the embodiment shown in FIG. 4a, in the embodiment shown in FIG. 4b no air-fluid transition is provided between the housings of switch cabinet 1 and cooling unit 2, with ambient air flowing through both housings in an antiparallel manner. The ambient air can be, for example, the air which is received in a cold aisle hot aisle arrangement between the rows of switch cabinets. For example, the switch cabinet housing can discharge the cold air drawn in via the rear side as heated air via its front side in the manner known from the prior art. In the arrangement according to the invention as shown in FIG. 4b, it can now be provided that the warm air from the warm aisle enters the cooling unit via the front of the cooling unit housing 2, where it passes the liquid-air heat exchanger 3 and enters the cold aisle at the rear of the arrangement as cooled air. The cooled air in the cold aisle may repeatedly enter the enclosure through the rear of the enclosure to flow over the components 4 requiring cooling.

The embodiment according to the embodiment according to FIG. 4c differs from the embodiment according to FIG. 4b in that the housings of cooling unit 2 and switch cabinet 1 have an offset in the horizontal direction, whereby the cooled air exiting laterally at the rear of cooling unit housing 2 enters switch cabinet 1 via the rear. In the manner already described, the cooled air flows over the components 4 requiring cooling and is heated in the process. At the front of the switch cabinet housing, the heated air again exits laterally from the switch cabinet 1 to be blown directly in front of the front of the cooling unit housing 2, where it can again be drawn into the housing 2 via the fan 19 and transported through the air-refrigerant heat exchanger 3 to then blow the air out again as cooled air laterally at the rear of the cooling unit housing 2 directly in front of the rear of the switch cabinet housing 1.

In the further FIGS. 5 to 20, the cooling of heat-emitting electrically operated components in an essentially closed enclosure is shown as an example, wherein the medium G1 is cooled by component A1 with an air or gas cooler WÜ1, with the cooling medium KM1, and G1 mainly flows back and forth between cooling and electrically operated objects located in the enclosure. G1 is thereby cooled in a device or component (A1) located adjacent to the enclosure and/or in the enclosure and/or connected to the enclosure by substantially closed channels (sheet metal channels, hoses or also brushes). A1 can be used to cool one or more enclosures such as IT racks or switch cabinet enclosures.

KM1 may consist of a solid or liquid or gaseous or multiphase or phase-changing coolant material of one or more substances. KM1 can preferably be water or water with additives or a refrigerant with a reduced condensation temperature compared to water.

In addition to cooling G1, further cooling of a second cooling medium KM2 is performed by component A1. KM2 may consist of a solid or liquid or gaseous or multiphase or phase-changing cooling substantially dielectric material of one or more substances. This may preferably be 1,1,1,2,2,4,5,5-nonafluoro-4-(trifluoromethyl)-3-pentanone or 1,1,1,2,3,3-heptafluoro-3-methoxypropane with various possible degrees of purity (high purity or impure).

Cooling of KM2 takes place through KM1 by means of a heat exchanger WÜ2, with or without mixing of KM1 and KM2. KM1 can first cool components or device G1 and then cool medium KM2 or vice versa or in parallel.

In a further embodiment, G1 or KM2 may also be cooled in a separate circuit by a cooling medium KM3. KM3 may comprise a solid or liquid or gaseous or multiphase or phase-changing cool substantially dielectric material of one or more substances. KM3 may preferably be water or water with additives or refrigerant.

KM2 is then provided as again cooling material for at least one electrically operated device or such a component which can become even warmer than KM2 (in particular semiconductor elements, such as CPUs) by means of a suitable channel, in particular at least one tube and/or hose.

In this case, the at least one electrically operated device or component to be cooled is located in an enclosure and is cooled with KM2, whereby other electrically operated devices or components can be located in the same or another enclosure, which are cooled with G1.

The cooling medium is provided in particular by hydraulically communicating tubes, a wire mesh or a pump, in particular an electrically or pneumatically driven pump or a thermally driven bladder pump or a combination thereof. Here, in particular embodiments, the cooling temperature of KM2 is matched to the maximum allowable or economically optimal cooling temperature of the component to be cooled. In particular, the cooling temperature can be adjusted by changing the pressure to change the condensation temperature or by selecting the KM2 cooling medium.

The cooling medium KM2 is heated or not heated by the at least one object to be cooled. The phase of KM2 is wholly or partially changed (in particular wholly or partially evaporated), discharged again through the same channel or one or more other channels. If the component is not giving off heat, the provision of KM2 may be stopped in whole or in part by a control of some kind, or it may continue. KM2 may be running in the duct, stationary, or the duct may be idle. The supply of KM2 may be unregulated and in such a way that KM2 always runs through the cooler and evaporates or drains over an overflow edge.

A well thermally conductive hollow body is mounted on the semiconductor component, which is filled with an electrically non-conductive liquid with a suitable evaporation temperature. To ensure that there is always a sufficient liquid level above the chip area intended for heat dissipation, the hollow body can be designed as follows:

The hollow body has an inlet and an outlet, whereby the outlet is designed in such a way that a volume not filled with coolant remains above the outlet opening during normal operation. For this purpose, the inlet is limited by a suitable orifice in the line in such a way that more coolant always enters the hollow body than can evaporate at maximum heat input. The outlet, on the other hand, is designed so large that more coolant can always escape in both liquid and gaseous phases than is introduced through the inlet.

The inlet and outlet of the heat conducting body are designed in such a way that there is always a vertical gradient to ensure that evaporation in the hollow body is not hindered by coolant backing up in the outlet.

The invention is primarily for indirect or direct cooling of heat-emitting components in enclosures, in particular of one or more servers (especially in clusters of servers), such that some components thereof are cooled by a corresponding KM2 and other components (especially those having higher temperature resistance) are cooled by the cooled G1, whereby the G1 can be used with a higher inlet temperature than previously necessary due to this separation of the cooling systems, in particular to achieve a higher inlet and outlet temperature of KM1.

In a further variant is used for indirect or direct cooling of heat emitting objects in enclosures, in particular of one or more servers (especially in collections of servers, so that some components are cooled by a corresponding KM2 and other components are cooled by the cooled air, whereby the air, by this separation of the cooling systems, can be used with a higher inlet temperature than previously usual or a previously usual inlet temperature, in particular to achieve a higher outlet temperature of KM1.

A further variant is used for indirect or direct cooling of heat-emitting objects in enclosures, in particular of one or more servers (especially in collections of servers), so that some components are cooled by a corresponding KM2 and other components are cooled by the cooled air, whereby the air can be used in this separation with a higher inlet temperature than previously usual or a previously usual inlet temperature, in particular in order to achieve a particularly high heat transfer performance of the cooling by means of a high temperature difference between the condensation temperature of KM 2 and previously usual cold KM1 and thus to achieve a particularly high cooling performance per semiconductor element or per component A1 or to reduce the volume of the components A1.

The solutions described offer new possibilities due to their type of cooling, in particular for increasing the heat flux density selectively where it may become necessary or for miniaturizing heat-emitting objects. For other heat-emitting objects, the invention enables a selective increase of the cooling temperature in order to save costs or to be able to release the energy absorbed in KM1 more easily to the environment at a higher temperature level or to be able to use it further, in particular for heating and/or drying purposes and/or for heating thermally operated refrigerating machines.

Deviating from this, the KM2 may contain a liquid and/or gas phase when returning from the objects to be cooled to the heat exchanger, partial amounts of which may condense on the way. In this case, the liquid phase collects at the bottom of the header due to gravity. The liquid phase can be transported from the receiver to the liquid line or to the heat exchanger 2 by the following mechanisms without using a motor-driven controlled pump:

Drainage by capillary action with an appropriate mesh, evaporation with thermal energy, or with the aid of a bladder or venturi pump. Provision can be made to allow a column of liquid to form, which actuates a (float) valve and allows the liquid to drain into the liquid line.

It may be provided that liquid portions of the heated and partially vaporized KM2 are carried along by a collector line in which the gas is entrained and accelerated (by constriction of the line) in such a way that it also entrains the liquid against the force of gravity.

A direct flow of the heated KM2 into the heat exchanger 2 can be provided, which cools KM2 with KM1, so that no header is needed and the liquid fractions do not have to be transported against gravity. In particular, this can be realized by a shell-and-tube heat exchanger or a coil-and-tube heat exchanger, or by a plate heat exchanger in which the inflow of KM2 is distributed to the plate passages.

Computers, servers and IT equipment are being built smaller and smaller these days. However, the heat generated in the CPUs/GPUs is not reduced to the same extent, but even increased in some cases. An enormous cost-saving potential on the part of data center operators is the possibility of overclocking the servers. In this mode of operation, the computing power of the servers can be increased so that fewer servers have to be operated, but this also further increases the heat load per CPU/GPU. Therefore, cooling solutions must dissipate increasingly higher loads per area while also being compact. Active air cooling cannot achieve sufficient heat transfer coefficients as water-liquid cooling or refrigerant evaporative cooling can. In addition, air heat exchangers require high heat transfer surfaces and additional fans, which increases space requirements, electrical power consumption, and noise. When cooling with a conductive liquid such as water, there is a risk that leaks could cause severe damage to servers, which is why many users do not prefer such cooling. Therefore, it makes sense to use a dielectric fluid for cooling. In addition to high air velocities through fans past large heat-transferring surfaces, air cooling also requires large temperature differences to dissipate heat. This temperature difference can be reduced by refrigerant cooling because the heat transfer coefficient is so much greater. However, other components in servers and server racks still need to be cooled with air because refrigerant cooling would be too costly and the heat loads per area are not as great. However, these components can also be cooled with warmer air (e.g. 40-50° C.) or designed for it, than the approx. 24 to 28° C. usually required for CPU/GPU air cooling.

Thus, the overall temperature level of the refrigeration can be greatly increased. The heat from the dielectric refrigerant 2 (KM2) and also the heat from the air can then be removed at a much higher temperature level. This is done in air-to-water server cabinet air conditioners or air-to-refrigerant server cabinet air conditioners, which also condense or cool the dielectric refrigerant (KM1) that cools the CPUs/GPUs with the cooling water or refrigerant (generally KM2). All heat energy is then supplied to KM1 in the device at a very high temperature level, so that, for example, cooling water temperatures with a supply temperature of 38° C. and a return temperature of 45° C. are achieved (approximately instead of, for example, supply 18° C. and return 25° C.). At this temperature level, the heat can be dissipated to the environment even in summer in many countries, and in winter it can also be used to heat buildings or bathrooms or similar. The purchase of a chiller can thus be unnecessary for many applications.

A direct transfer of heat through the KM2 to the ambient air can also be provided. However, special piping would have to be installed for this purpose, since, for example, the dielectric refrigerants 1,1,1,2,2,4,5,5-nonafluoro-4-(trifluoromethyl)-3-pentanone or 1,1,1,2,3,3-heptafluoro-3-methoxypropane have small vapor densities relative to other refrigerants and the evaporating temperature is very pressure sensitive relative to other refrigerants. Water or another refrigerant with higher vapor density and lower pressure sensitivity of evaporating temperature are therefore more suitable for transporting heat over a longer distance. By raising the temperature level in the supplied air as well, heat from the cooling air can also be transferred to KM1 at this high temperature level. Since neither KM2 nor the cooling air now need to be cooled to less than 40-50° C., a chiller is often not needed. By keeping this hot air in the cabinet, the working conditions in the data center are more comfortable for the employees.

FIG. 21 illustrates the fluid routing of the embodiment according to FIG. 3. Accordingly, a closed air routing system is described in which the air is circulated exclusively between the switch cabinet housing 1 and the cooling unit 2. In particular, no air supply is provided from outside the Switch cabinet arrangement. In contrast, cooled liquid, for example cooled water provided by a chiller, is supplied to the arrangement from outside via a supply 5. Via a return 16, the heated liquid is fed back to the recooler, for example to said chiller.

After leaving the air-liquid heat exchanger 3, the cooled air provided via the air-liquid heat exchanger 3 is first fed in its flow direction to the components 4, which may be the components of a server arrangement, for example. The air impinges on the server components 4, whereby a heat transfer from the components 4 to the air takes place, i.e. the air is heated. After the air has passed the components 4, it is fed back to the air-refrigerant heat exchanger 3 for recooling.

The cooled liquid provided via the supply line 5 is heated by the air passing through the air-liquid heat exchanger 3 and is introduced via a return line 6 of the heat exchanger 3 from the heat exchanger 3 as a heated liquid into a supply line 8 of a liquid-liquid heat exchanger 7. Via the liquid-liquid heat exchanger 7, a refrigerant circuit is recooled, via which an at least proportionally liquid refrigerant is fed to components 4 in particular need of cooling, i.e. components which have a high heat flux density. These components 4 can be CPUs, for example. For cooling the components, it may be sufficient that the liquid fed in this refrigerant circuit has a temperature that is substantially higher than the air circulated in the switch cabinet housing 1. For example, the fluid may have a temperature of about 50° C. Since the return temperature of the air-liquid heat exchanger may be, for example, 35° C., this already partially heated liquid is still sufficiently cool to provide re-cooling of the liquid for component direct cooling.

Accordingly, the liquid introduced from the heat exchanger 3 via the flow 8 into the heat exchanger 7 is further heated as it passes through the heat exchanger 7 and can be heated, for example, to 50° C., at which temperature the liquid then leaves the arrangement 1 again via the return 16, for example to be fed to a shill for renewed recooling and feeding into the flow 5.

Deviating from the embodiment according to FIGS. 3 and 21, FIGS. 22 and 23 show an embodiment in which the air in the arrangement is not circulated, but is guided through the arrangement from a rear side of the arrangement and leaves the arrangement again at a front side of the arrangement. In this case, the air flow entering the arrangement via the rear side is divided into a first partial flow and a second partial flow, the first partial flow acting on the cooling unit 2 and the second partial flow acting on the switch cabinet arrangement and, in particular, on the components 4 accommodated therein, which do not require liquid cooling, in order to cool them.

A further air-liquid heat exchanger 18 is arranged in the cooling unit 2, which is charged by the air passing through the cooling unit 2. Fans 19 may be provided to drive the air through the heat exchanger 18 at an adjustable flow rate. The liquid circuit to which the liquid-air heat exchanger 18 is connected is designed for direct component liquid cooling, as already described in principle with reference to the preceding embodiment.

Deviating from the previously described embodiments, no air-liquid heat exchanger for cooling the air with which, for example, the further air-liquid heat exchanger 18 and the components 4 are charged is provided directly in the cooling unit 2 or the switch cabinet housing 1. Rather, this may be accommodated outside the arrangement, for example in a raised floor of a data center in which the switch cabinet arrangement is installed.

Another embodiment is shown in FIGS. 24 and 25. In this embodiment, it is again provided that air is passed through the switch cabinet housing 1 for cooling components 4 accommodated in the IT rack or the switch cabinet housing 1. From the air passed through the housing, an air-liquid heat exchanger 18 is now further acted upon, wherein a liquid passed through the air-liquid heat exchanger 18 is supplied to at least one of the components 4 for heat transfer from the component 4 to the liquid and is discharged from the component 4 back into the air-liquid heat exchanger 18.

The air is thus again introduced into the switch cabinet housing 1 from outside the switch cabinet arrangement, for example via a rear side thereof. Again, the air first passes through the components 4, whereby in particular those components which do not have an excessively high heat flux density may already experience sufficient cooling. After leaving the components 4, for example after leaving a server housing in which the components 4 are accommodated, the air which is heated in the process passes through a liquid-air heat exchanger 18 which is now accommodated in a door 20 of the switch cabinet housing 1. The double-walled door 20 further includes a fan 19 which draws air into the enclosure 1 via the rear of the enclosure 1 so that the air passes through the components 4, whereupon the air enters the door 20 and passes through the heat exchanger 18. The heat exchanger 18 has a fluid transition downstream to a passage through a front face of the enclosure door, through which the further heated air can exit the enclosure 1 or door 20. The passage may alternatively be formed, for example, at the top of the door 20.

Optionally, but not necessarily, it may be provided that the heated air is supplied via a chimney 27 to a further air-liquid heat exchanger 26 for recooling. The air leaving the housing 2 may, for example, have a temperature of 50° C., since, as has already been pointed out with reference to the previously described embodiments, it is heated to a correspondingly high level due to the higher temperature level exhibited by the liquid used for direct liquid cooling of the components 4.

FIGS. 26 and 27 describe an embodiment which is analogous to the embodiment according to FIGS. 3 and 21, with the cooling unit 2 now being arranged in the door 20 instead of a side housing. In particular, the liquid-air heat exchanger 3 and the liquid-liquid heat exchanger 7 fluidically connected thereto are both arranged in the door 20. Further deviating from the embodiment according to FIGS. 3 and 21, it is provided in this embodiment, analogously to the embodiment according to FIGS. 24 and 25, that the air is not circulated in a closed system, but enters the switch cabinet housing 1 via the rear side of the switch cabinet arrangement and exits the switch cabinet housing 1 again via the front side of the switch cabinet housing, in particular via the door 20.

The further liquid-to-air heat exchanger 26 may be, for example, a heat exchanger disposed in a data center wall and separating, for example, the space of a data center from the environment of the data center or from another space in which a hot aisle or a hot aisle of the data center air conditioning system is provided.

The features of the invention disclosed in the foregoing description, in the drawings as well as in the claims may be essential to the realization of the invention both individually and in any combination.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A switch cabinet arrangement having at least one IT rack or switch cabinet housing and having at least one cooling device which has a first air-liquid heat exchanger for cooling components accommodated in the IT rack or switch cabinet housing with cooled air, wherein the first air-liquid heat exchanger comprises a first flow for cooled liquid and a first return for heated liquid, characterized in that the cooling device comprises a liquid-liquid heat exchanger of a liquid cooling of the components, to the second flow of which the first return of the first air-liquid heat exchanger is connected, wherein a first of the two liquids passed through the liquid-liquid heat exchanger has a boiling point under standard conditions that is below the boiling point of a second of the two liquids passed through the liquid-liquid heat exchanger, and wherein the second liquid is the liquid passed through the first air-liquid heat exchanger.

2. The switch cabinet arrangement of claim 1, wherein the first air-liquid heat exchanger is part of a first cooling circuit and the liquid-liquid heat exchanger is part of a second cooling circuit separate from the first cooling circuit.

3. The switch cabinet arrangement of claim 1, wherein the liquid passed through the first air-liquid heat exchanger is water or a liquid comprising mostly water.

4. The switch cabinet arrangement according to claim 1, wherein the boiling point of the first liquid is at least 20 K, more preferably at least 30 K, and most preferably at least 40 K below the boiling point of the second liquid.

5. The switch cabinet arrangement of claim 4, wherein the first of the two liquids passed through the liquid-liquid heat exchanger is or comprises a perfluorinated chemical compound, preferably a compound derived from ethyl isopropyl ketone, more preferably perfluoro(2-methyl-3-pentanone), $C_6F_{12}O$.

6. The switch cabinet arrangement of claim 4, wherein the first of the two liquids passed through the liquid-liquid heat exchanger is introduced from a third return of the liquid-liquid heat exchanger into a liquid-carrying heat conducting body for conduction cooling.

7. The switch cabinet arrangement of claim 6, wherein the first of the two liquids passed through the liquid-liquid heat exchanger is introduced from the liquid-carrying heat conducting body into a third flow of the liquid-liquid heat exchanger.

8. The switch cabinet arrangement according to claim 1, wherein the liquid-liquid heat exchanger is the cooling zone of a heat pipe or a manifold.

9. The switch cabinet arrangement of claim 8, wherein the heat pipe or the manifold comprises a down pipe and a riser pipe, which are formed as fluidically separated vertical pipes or are fluidically connected to each other in a lowermost region of the heat pipe via a siphon.

10. The switch cabinet arrangement of claim 8, wherein the heat pipe includes a down pipe into which first liquid cooled from the liquid-to-liquid heat exchanger is introduced.

11. The switch cabinet arrangement of claim 8, wherein the heat pipe comprises a riser pipe into which heated first liquid is introduced.

12. The switch cabinet arrangement according to claim 1, wherein liquid cooled by a recooler, for example a chiller, is introduced into the air-liquid heat exchanger via the first flow for cooled liquid.

13. The switch cabinet arrangement of claim 12, wherein the cooled liquid is introduced into the recooler as a heated liquid from the liquid-to-liquid heat exchanger.

14. The switch cabinet arrangement according to claim 1, wherein the cooling device is a cooling device arranged in a row of IT racks or switch cabinet housings, via the rear side or front side of which hot air is drawn in from a hot aisle and blown out as cooled air into a cold aisle via the side opposite the rear side or front side.

15. The switch cabinet arrangement according to claim 1, wherein the air-liquid heat exchanger of the first circuit and the liquid-liquid heat exchanger of the second circuit are accommodated in a rear or front door of the IT rack or the switch cabinet housing, wherein the air-liquid heat exchanger and the liquid-liquid heat exchanger have air flowing through them, which enters the IT rack or the switch cabinet housing on a side arranged opposite the rear or front door.

* * * * *